(12) United States Patent
Mori et al.

(10) Patent No.: US 7,476,948 B2
(45) Date of Patent: Jan. 13, 2009

(54) MICROMINIATURE MOVING DEVICE AND METHOD OF MAKING THE SAME

(75) Inventors: Keiichi Mori, Tokyo (JP); Yoshichika Kato, Tachikawa (JP); Satoshi Yoshida, Tama (JP); Kenji Kondou, Chofu (JP); Yoshihiko Hamada, Akiruno (JP); Osamu Imaki, Hachioji (JP)

(73) Assignee: Japan Aviation Electronics Industry Limited, Tokyo (JP)

( * ) Notice: Subject to any disclaimer, the term of this patent is extended or adjusted under 35 U.S.C. 154(b) by 0 days.

(21) Appl. No.: 11/069,184

(22) Filed: Feb. 28, 2005

(65) Prior Publication Data

US 2005/0194840 A1 Sep. 8, 2005

(30) Foreign Application Priority Data

Mar. 3, 2004 (JP) ............................. 2004-059495
Jan. 18, 2005 (JP) ............................. 2005-010514

(51) Int. Cl.
*H01L 29/82* (2006.01)

(52) U.S. Cl. ........................ 257/415; 257/432; 257/417; 257/E21.613; 257/E29.324; 438/50; 438/51; 438/52

(58) Field of Classification Search .................... 257/98, 257/414, 623, 415, 428, 431, 417, E21.613, 257/E29.324; 438/50, 51, 52, 53, 436; 29/592, 29/592.1

See application file for complete search history.

(56) References Cited

U.S. PATENT DOCUMENTS

| | | | | |
|---|---|---|---|---|
| 5,548,673 | A * | 8/1996 | Kitamura et al. | 385/49 |
| 5,998,906 | A * | 12/1999 | Jerman et al. | 310/309 |
| 6,198,145 | B1 * | 3/2001 | Ferrari et al. | 257/415 |
| 6,208,013 | B1 * | 3/2001 | Suzuki | 257/623 |
| 6,315,462 | B1 * | 11/2001 | Anthamatten et al. | 385/83 |
| 6,887,732 | B2 * | 5/2005 | Gopal et al. | 438/50 |
| 2003/0027370 | A1 * | 2/2003 | Helin | 438/50 |

FOREIGN PATENT DOCUMENTS

WO   WO 02/090244   11/2002

\* cited by examiner

*Primary Examiner*—W. David Coleman
*Assistant Examiner*—Su C Kim
(74) *Attorney, Agent, or Firm*—David N. Lathrop, Esq.; Gallagher & Lathrop

(57) ABSTRACT

In a microminiature moving device that has disposed, on a single-crystal silicon substrate, movable elements (a movable rod 46, a movable comb electrode 49, etc.) displaceable in parallel to the substrate surface and stationary parts (a stationary part 40a, etc.), the stationary parts are fixedly secured to the single-crystal silicon substrate 61 with an insulating layer 62 sandwiched therebetween, and depressions 64 are formed in those surface regions of the single-crystal silicon substrate 61 where no stationary parts are present, and the movable parts are positioned above the depressions 64. The depressions 64 form gaps 50 large enough to prevent foreign bodies from causing troubles such as malfunction of the movable parts and shoring.

11 Claims, 20 Drawing Sheets

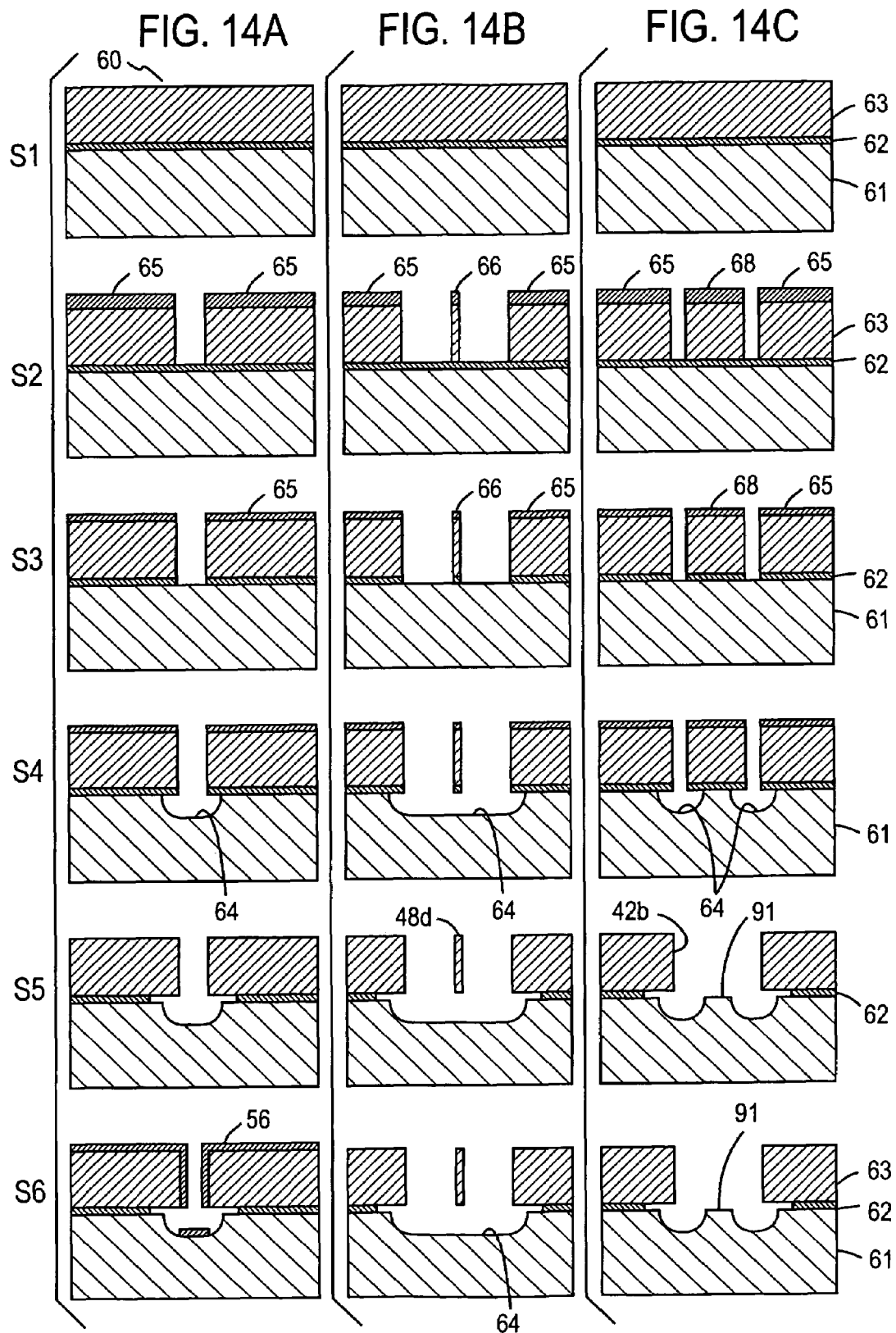

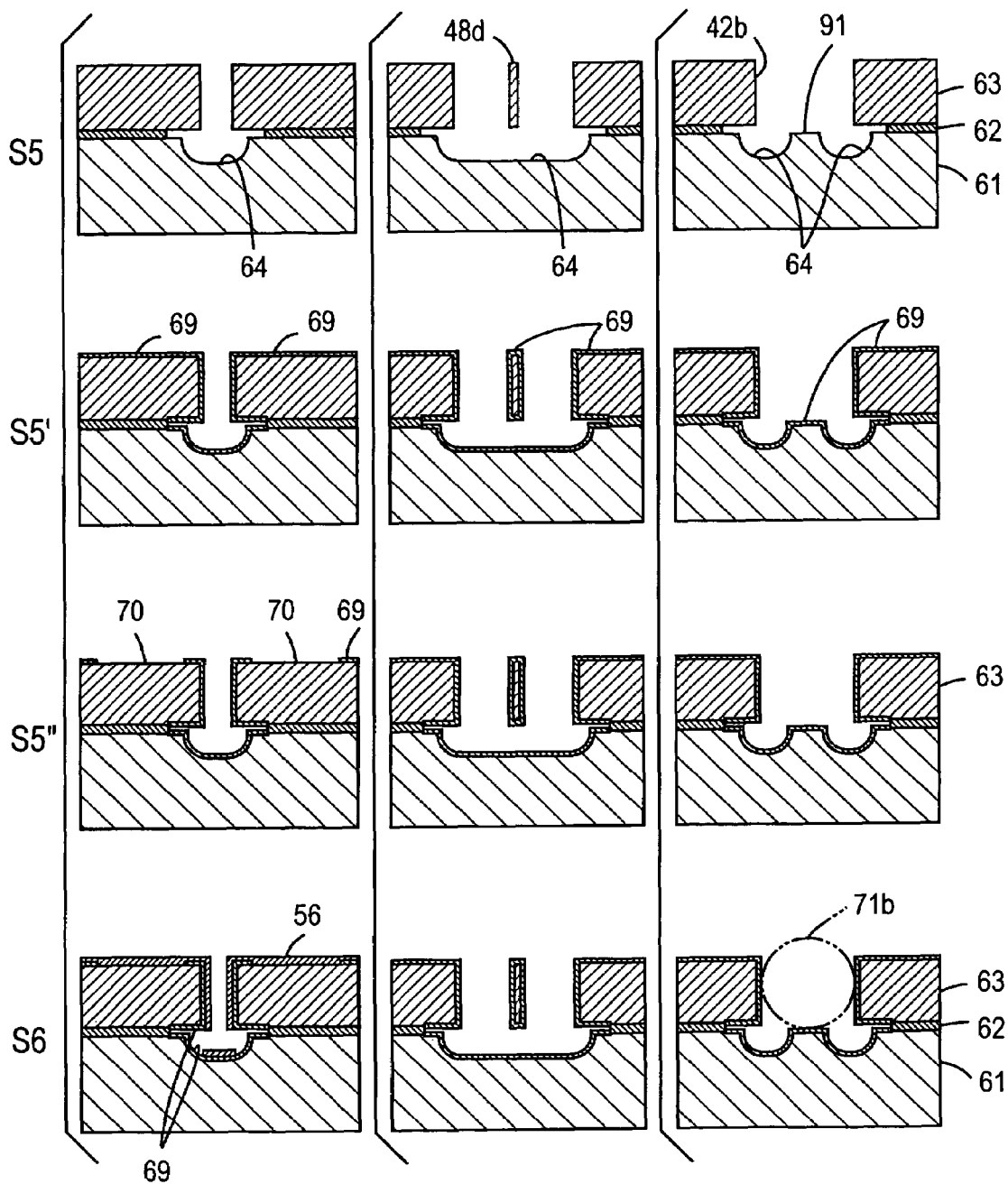

MICROMINIATURE MOVING DEVICE AND METHOD OF MAKING THE SAME

BACKGROUND OF THE INVENTION

The present invention relates to a microminiature moving device that is fabricated by micromachining technologies including photolithography, etching, etc. and, more particularly, to a microminiature moving device provided with moving parts that are freely displaceable in parallel to the substrate surface.

Microminiature moving devices of this kind include such, for example, as a microminiature optical switch, a microminiature accelerometer, and microminiature relay device. These microminiature moving devices are usually fabricated using a three-layered SOI (Silicon On Insulator) substrate that has an insulating layer sandwiched between a single-crystal silicon layer and a singe-crystal silicon substrate.

FIG. 1 shows, as a prior art example of the microminiature moving device, the optical switch described in U.S. Pat. No. 6,315,462 (issued Nov. 13, 2001, hereinafter referred to as document 1). FIG. 2 shows a sequence of steps involved in the manufacture of the optical switch disclosed in document 1. Referring first to FIG. 1, the configuration of the optical switch will be described.

In the top surface of a plate-like flat substrate 11, which is an SOI substrate, there are formed crosswise four optical fiber insertion channels 12a to 12d, providing an actuator forming area 11' defined by the fiber insertion channels 12a and 12b extending at right angles to each other. In the actuator forming area 11' there is formed a slot 13 extending at an angle of 45° with respect to the fiber insertion channels 12a and 12b, respectively. Disposed in the slot 13 is a movable rod 14.

The movable rod 14 carries at one end thereof a mirror 15, which is initially positioned at the intersection area 16 of the four fiber insertion channels 12a to 12d extending at right angles to one another. The movable rod 14 has coupled to its both sides intermediately thereof support beams 17a and 17b at one end thereof, the other ends of the support beams 17a and 17b being fixed to stationary parts 19a and 19b through leaf-spring-like support elements 18a and 18b, respectively. Similarly, support beams 17c and 17d are each coupled at one end to either side of the other end of the movable rod 14 opposite to its inner end, and the other ends of the support beams 17c and 17d are also fixed to the stationary parts 19a and 19b through leaf-spring-like support elements 18c and 18d, respectively. Thus the leaf-spring-like support elements 18a through 18d allow the movable rod 14 to move lengthwise thereof.

The movable rod 14 is driven by a comb-type electrostatic actuator, which is composed of movable comb electrodes 21a to 21d fixed to the support beams 17a to 17d, respectively, and stationary comb electrodes 22a to 22d fixedly formed in the actuator forming area 11' so that they are interleaved with the movable comb electrodes 21a to 21d, respectively.

A voltage application between the movable comb electrodes 21a, 21b and the stationary comb electrodes 22a, 22b creates an electrostatic attractive force, driving the movable rode 14 toward the afore-mentioned intersection area 16. On the other hand, a voltage application between the movable comb electrodes 21c, 21d and the stationary comb electrodes 22c, 22d creates an electrostatic attractive force, driving the movable rod 14 away from the intersection area 16. Accordingly, driving the movable rod 14 by the comb-type electrostatic actuator through selective voltage application allows the mirror 15 to be pushed into and pulled out of the intersection area 16.

In the four fiber insertion channels 12a to 12d there are disposed optical fibers 23a to 23d, respectively. With the mirror 15 held at the intersection area 16, light emitted from the optical fiber 23a, for instance, reflects off the mirror 15 and impinges on the optical fiber 23d, and light emitted from the optical fiber 23b also reflects off the mirror 15 and strikes on the optical fiber 23c. With the mirror 15 pulled out of the intersection area 16, the light emitted from the optical fiber 23a is incident on the optical fiber 23c, and the light emitted from the optical fiber 23b is also incident on the optical fiber 23d. In this way, the optical path is switched.

FIG. 2 shows a sequence of steps S1 to S3 involved in the manufacture of the conventional optical switch described above. The manufacture starts with step S1 in which an SOI substrate 30 is prepared which has a silicon dioxide ($SiO_2$) insulating layer 32 sandwiched between a single-crystal silicon layer 33 and a single-crystal silicon substrate 31, which is followed by the formation of a mask 34 of a required pattern over the entire surface area of the single-crystal silicon layer 33 by patterning. Then in step S2 the single-crystal silicon layer 33 is selectively etched away down to the surface of the insulating layer 32 by reactive ion etching (RIE) through the mask 34, leaving the required pattern all over the insulating layer 32.

The thin webs 35 of the single-crystal silicon layer 33 formed in step S2 correspond to such movable elements as the movable rod 14, the mirror 15, the support beams 17a to 17d, the leaf-spring-like support elements 18a to 18d and the movable comb electrodes 21a to 21d in FIG. 1, whereas the thick webs 36 will ultimately form the stationary parts 19a, 19b and other stationary members that are fixed to the single-crystal silicon substrate 31 in FIG. 1. In FIG. 2 the movable elements and the stationary parts are merely exemplified.

Then in step S2 the exposed insulating layer 32 is subjected to wet etching until the insulating layer 32 underlying the thin webs 35 is removed by side etching. As a result, the thin webs 35 are suspended slightly above the single-crystal silicon substrate 31 as indicated by 37 in step S3; that is, the movable elements formed by the thin webs 35 are severed by the selective removal of the insulating layer 32 from the single-crystal silicon substrate 31 so that they are freely displaceable. The thin web 35 of the single-crystal silicon layer 33, which forms the mirror 15, is coated on both sides thereof with reflecting films.

With the manufacturing method shown in FIG. 2, the insulating layer 32 of the SOI substrate 30, which underlies the movable elements formed by the single-crystal silicon layer 33, is etched away to permit displacement of the movable elements.

As described above, the microminiature moving device of the type having movable elements displaceable in parallel to the substrate surface is usually fabricated using the SOI substrate 30, and the intermediate insulating layer 32 is selectively etched away to form the movable elements (thin webs 35) each separated by a slight gap from the underlying single-crystal silicon substrate 31.

Since the intermediate insulating layer 32 of the SOI substrate 30 is typically 3 µm or so at a maximum, however, the gap between the movable elements (thin webs 35) and the single-crystal silicon substrate 31 is so narrow that even the smallest foreign body in the gap will be likely to disturb normal working of the movable elements.

Furthermore, at the same time as the insulating layer 32 underlying the movable elements (thin webs 35) is etched away, the insulating layer 32 underlying the stationary parts (thick webs 36) is also removed by side etching to form between the stationary parts (thick webs 36) and the underlying single-crystal silicon substrate 31 a gap of the same width as that of the side etching of the insulating layer 32 underlying the movable parts (thin webs 35); hence, foreign bodies may sometimes get into the gap, too. In this instance, there is a fear of shorting the single-crystal silicon substrate 31 and the stationary parts (thick webs 36) via the foreign bodies—this may occasionally produce the situation of shorting the stationary parts (thick webs 36) via the foreign bodies and the single-crystal silicon substrate 31.

Accordingly, the conventional microminiature moving device has the defect of accidental shorting and hence malfunction of the two stationary parts that are used as electrodes for voltage application to the comb-type electrostatic actuator.

SUMMARY OF THE INVENTION

It is therefore an object of the present invention to provide a microminiature moving device that can be fabricated using an SOI substrate and configured to obviate the above-mentioned problems of the prior art.

Another object of the present invention is to provide a method of manufacturing the microminiature moving device.

According to the present invention, there is provided a microminiature moving device that has disposed, on a single-crystal silicon substrate, movable elements displaceable in parallel to the surface of the single-crystal silicon substrate, and stationary parts, wherein: the stationary parts are fixed to the single-crystal silicon substrate with an insulating layer sandwiched therebetween; and depressions are formed in those surface areas of the single-crystal silicon substrate where no stationary parts are present, the movable elements being disposed above the depressions.

According to the present invention, there is provided a method for the manufacture of the above microminiature moving device, which comprises the steps of: forming a mask layer all over the top surface of a single-crystal silicon layer of a three-layered SOI substrate having an insulating layer sandwiched between the single-crystal silicon substrate and the single-crystal silicon layer; patterning the mask layer to form masks for the stationary parts and masks for the movable elements which are composed of a combination of narrow patterns; selectively etching away the single-crystal silicon layer by gas-reactive dry etching through the masks until the insulating layer is exposed; covering sidewalls of the single-crystal silicon layer vertical to the surface of the substrate, formed by the dry etching, with sidewall protective films; etching away those exposed portions of the insulating layer to expose the top surface of the single-crystal silicon substrate; performing isotropic etching of the exposed surface portions of the single-crystal silicon substrate until its surface regions underlying the movable elements are etched away; and removing the masks and the sidewall protective films.

With the microminiature moving device according to the present invention, since the SOI substrate can be used as in the prior art and since the depressions are formed, it is possible to obviate the problem of malfunction of the movable elements by foreign bodies caught in gaps between the single-crystal silicon substrate and the movable elements disposed above the gaps, and the problem of shorting of the single-crystal silicon substrate and the stationary parts fixedly mounted thereon via the foreign bodies in the gaps.

Accordingly, the microminiature moving device according to the present invention is excellent in performance characteristics and hence is highly reliable.

With the manufacturing method according to the present invention, it is possible to manufacture such a highly reliable microminiature moving device using, for example, a commercially available SOI substrate.

BRIEF DESCRIPTION OF THE DRAWINGS

FIG. 14A shows, in cross-section along the line A-A in FIG. 8, a sequence of steps involved in another example of the method for manufacturing the optical switch of FIG. 8;

FIG. 14B shows, in cross-section along the line B-B in FIG. 8, the sequence of steps involved in the optical switch manufacturing method;

FIG. 14C shows, in cross-section along the line C-C in FIG. 8, the sequence of steps involved in the optical switch manufacturing method;

FIG. 15A shows, in cross-section, modifications of the manufacturing steps of FIGS. 11A and 14A;

FIG. 15B shows, in cross-section, modifications of the manufacturing steps of FIGS. 11B and 14B;

FIG. 15C shows, in cross-section, modifications of the manufacturing steps of FIGS. 11C and 14C;

FIG. 17-1 schematically shows a sequence of steps S1 to S4 involved in the manufacture of the optical switch of FIG. 16;

FIG. 17-2 schematically shows the subsequent steps S5 to S8 involved in the manufacture of the optical switch of FIG. 16;

FIG. 21-1 schematically shows a sequence of steps S1 to S4 involved in another method for the manufacture of the optical switch of FIG. 18; and FIG. 21-2 schematically shows the subsequent steps S5 to S8 involved in the manufacture of the optical switch of FIG. 18.

DETAILED DESCRIPTION OF THE PREFERRED EMBODIMENT

With reference to the accompanying drawings, the present invention will hereinafter be described as being applied to optical switches.

Embodiment 1

Figure 3:
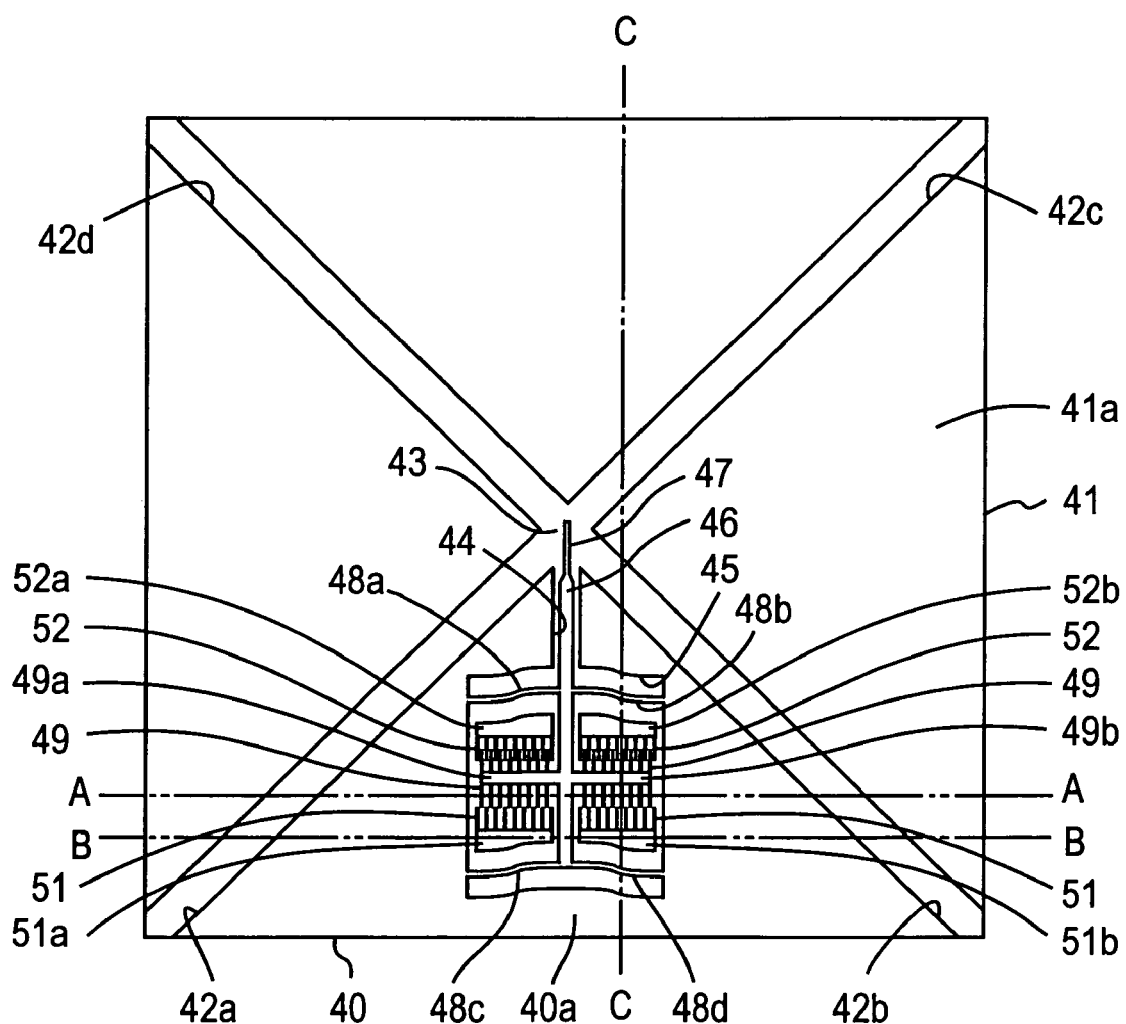
FIG. 3 is a top plan view illustrating an optical switch according to a first embodiment of the present invention.

FIG. 3 is a top plan view illustrating an optical switch fabricated using an SOI substrate. In the top surface 41a of a flat substrate 41 there are formed crosswise four optical fiber receiving channels 42a to 42d. One of four substrate surface areas divided by the four optical fiber receiving channels 42a to 42d is used as an actuator forming area 40. In the actuator forming area 40 there is formed a slot 44 that communicates with the intersection 43 of the four optical fiber receiving channels 42a to 42d and divides the actuator forming area 40 into two; furthermore, in the actuator forming area 40 there is formed a recess 45 that communicates with the slot 44 at the end opposite to the intersection 43. The part of the actuator forming area 40, except the slot 44 and the recess 45, is used as a stationary part 40a.

In the slot 44 there is slidably received a movable rod 46, which carries a mirror 47 at the inner end near the intersection 43. The movable rod 46 extends partly in the recess 45, in which leaf-spring support members 48a and 48b are coupled at one end to the intermediate portion of the rod 46 on both sides thereof and leaf-spring support members 48c and 48d are similarly coupled at one end to the outer end portion of the rod 46; accordingly, the movable rod 46 is supported by the leaf-spring support members 48a to 48d to the stationary part 40a in such a manner that the movable rod 46 freely displaceable lengthwise thereof in parallel to the top surface 41a of the substrate 41.

Between the leaf-spring support members 48a, 48b and 48c, 48d there is disposed a comb-type electrostatic actuator, which has its movable comb electrodes 49 fixed to both sides of the movable rod 46. The movable comb electrodes 49 are disposed immediately on both sides of support arms 49a and 49b widthwise thereof which are fixed at one end to the movable rod 46.

On both sides of the support arms 49a and 49b there are disposed first and second stationary comb electrodes 51 and 52 adjacent the movable comb electrodes 49 so that they are interleaved with each other. The first and second stationary comb electrodes 51 and 52 are fixed to stationary parts 51a, 51b and 52a, 52b, respectively. In the recess 45 there are located the outer half of the movable rod 46, the support arms 49a, 49b, the movable comb electrodes 49, the leaf-spring support members 48a to 48d, the first and second stationary comb electrodes 51, 52, and the stationary parts 51a, 51b, 52a and 52b. The stationary parts 51a, 51b, 52a and 52b are fixed to the bottom of the recess 45 with an insulating layer 62 sandwiched therebetween as described later on.

Figure 4A:
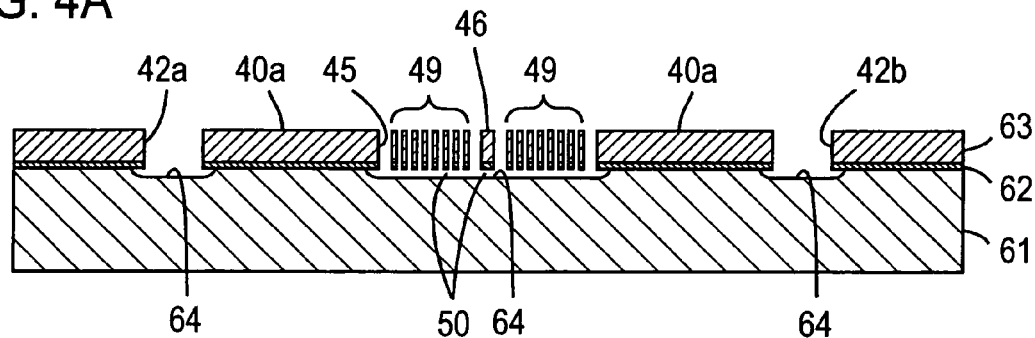
FIG. 4A is a cross-sectional view taken along the line A-A in FIG. 3.
Figure 4B:
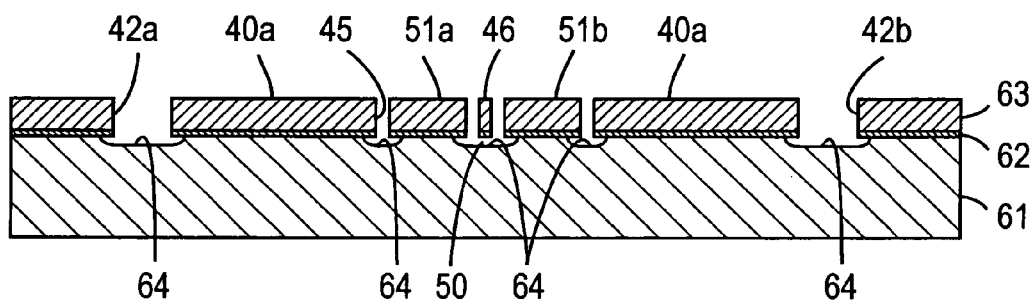
FIG. 4B is a cross-sectional view taken along the line B-B in FIG. 3.
Figure 4C:
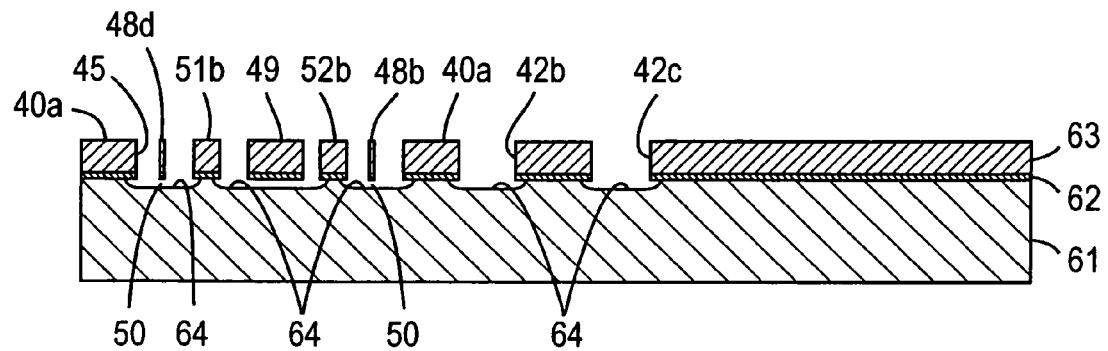
FIG. 4C is a cross-sectional view taken along the line C-C in FIG. 3.

FIGS. 4A through 4C are sectional views taken along the lines A-A, B-B and C-C in FIG. 3. The substrate 41 has a three-layered structure in which an insulating layer 62 formed by a silicon dioxide film is sandwiched between a single-crystal silicon substrate 61 and a single-crystal silicon layer 63. On the single-crystal silicon substrate 61 there are formed, by the single-crystal silicon layer 63, movable elements which are displaceable in parallel to the substrate surface, such as the movable rod 46, the mirror 47, the leaf-spring support members 48a to 48d, the support arms 49a, 49b and the movable comb electrodes 49.

Furthermore, there are similarly formed, by the single-crystal silicon layer 63, the stationary parts 51a, 51b and 52a, 52b for the first and second stationary comb electrodes 51 and 52, the stationary part 40a, and stationary parts by which the optical fiber receiving channels 42a to 42d. These stationary parts are fixed to the single-crystal silicon substrate 61 with the insulating layer 62 sandwiched therebetween. In the illustrated example the insulating layer 62 underlies the movable elements, too.

In the top surface of the single-crystal silicon substrate 61 there are formed depressions 64 between adjacent stationary parts, that is, in the surface areas where no stationary parts are located, as depicted in FIGS. 4A to 4C. The movable elements are positioned above such depressions 64, and hence they are separated by the depressions 64 from the single-crystal silicon substrate 61. The depressions 64 formed in the wafer surface over the range of displacement of the movable elements provides sufficient gaps 50 between them and the single-crystal silicon substrate 61.

Figure 5:
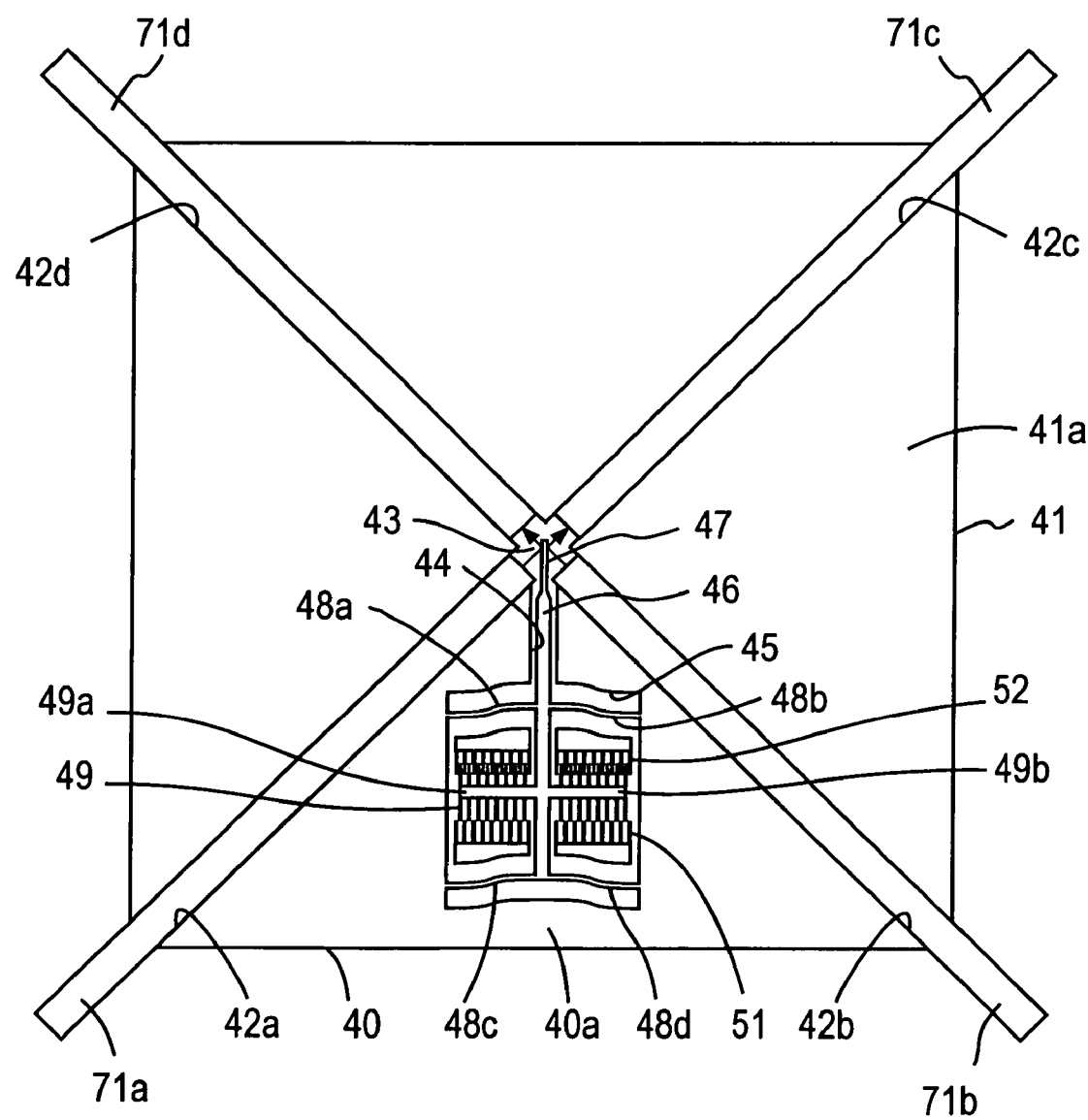
FIG. 5 is a plan view of the optical switch with optical fibers disposed in fiber insertion channels.

FIG. 5 shows the initial state in which optical fibers 71a to 71d are placed in the four optical fiber receiving channels 42a to 42d, respectively, in the optical switch of FIG. 3. In the illustrated initial state (first stable state) the mirror 47 is held at the intersection 43 of the optical fiber receiving channels 42a to 42d; light emitted from the optical fiber 71a, for instance, is reflected by the mirror 47 for incidence on the optical fiber 71d, and light emitted from the optical fiber 71b is similarly reflected by the mirror 47 for incidence on the optical fiber 71c.

Figure 6:
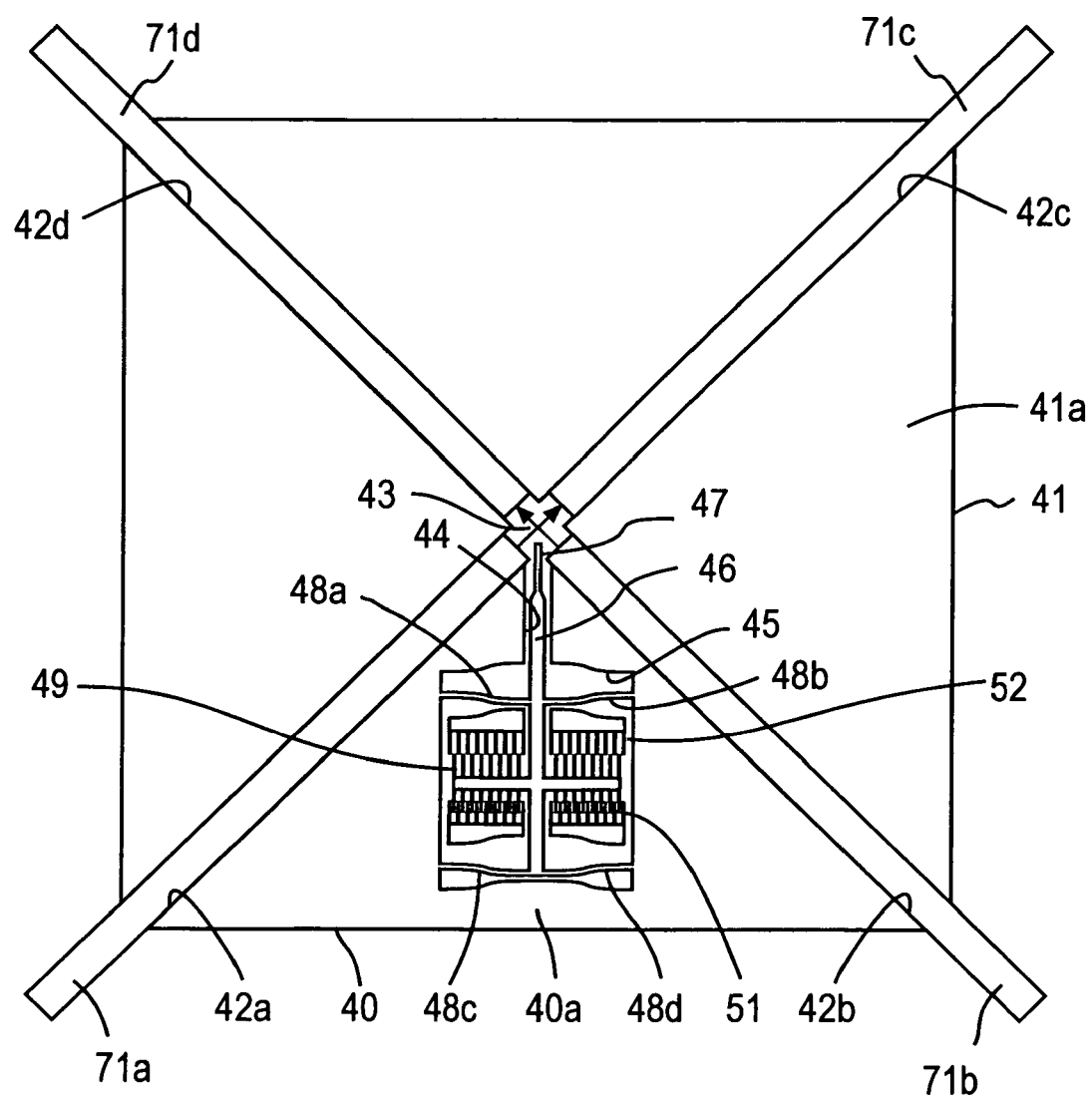
FIG. 6 is a plan view of the optical switch with a mirror pulled out of the intersection of the fiber insertion channels in FIG. 5.

Applying voltage to the first stationary comb electrodes 51 while grounding the second stationary comb electrodes 52 and the stationary part 40a electrically connected to the movable comb electrodes 49 via the support arms 49a, 49b, the movable rod 46 and the leaf-spring support members 48a to 48d, an electrostatic attractive force created between the first stationary comb electrodes 51 and the movable comb electrodes 49, and when the attractive force is greater than the force for holding the leaf-spring support members 48a to 48d in the first stable state, they reverse to such a second stable state as shown in FIG. 6 and remain self-held even after interruption of the voltage application. At this time, the mirror 47 is pulled out of the intersection 43, in which case lightwaves emitted from the optical fibers 71a and 71b travel in straight lines and impinge intact on the optical fibers 71c and 71d, respectively.

The above-mentioned first and second stable states can be brought about by slightly deflecting the leaf-spring support members 48a to 48d at their central portions lengthwise thereof while keeping their outer end portions in parallel to one another. By applying voltage to the second stationary comb electrodes 52 while grounding the stationary part 40a and the first stationary comb electrodes 51, an electrostatic attractive force is generated between the second stationary comb electrodes 52 and the movable comb electrodes 49, and when the attractive force is greater than the force for holding the leaf-spring support members 48a to 48d in the second stable state, they return to the first stable state shown in FIG. 5.

The voltage application across the first or second stationary comb electrodes 51 or 52 and the movable comb electrodes 49 can be achieved, for example, by connecting bonding wires to the stationary parts 51a, 51b and 52a, 52b to which the first and second stationary comb electrodes 51 and 52, respectively, and applying voltage across the bonding wires and the stationary part 40a.

With the optical switch of the above-described structure, the movable elements (the movable rod 46, the mirror 47, the leaf-spring support members 48a to 48d, the support arms 49a, 49b, and the movable comb electrodes 49), which are displaced in parallel to the top surface of the single-crystal silicon substrate 61, are widely separated from the single-crystal silicon substrate 61 by the presence of the depressions 64 formed in the latter. As compared with the gap approximately 3 µm in the prior art, the formation of the depressions 64 provides wide gaps 50—this obviates the problem that foreign bodies get into the gaps 50 and hinder movement of the movable elements.

Figure 7:
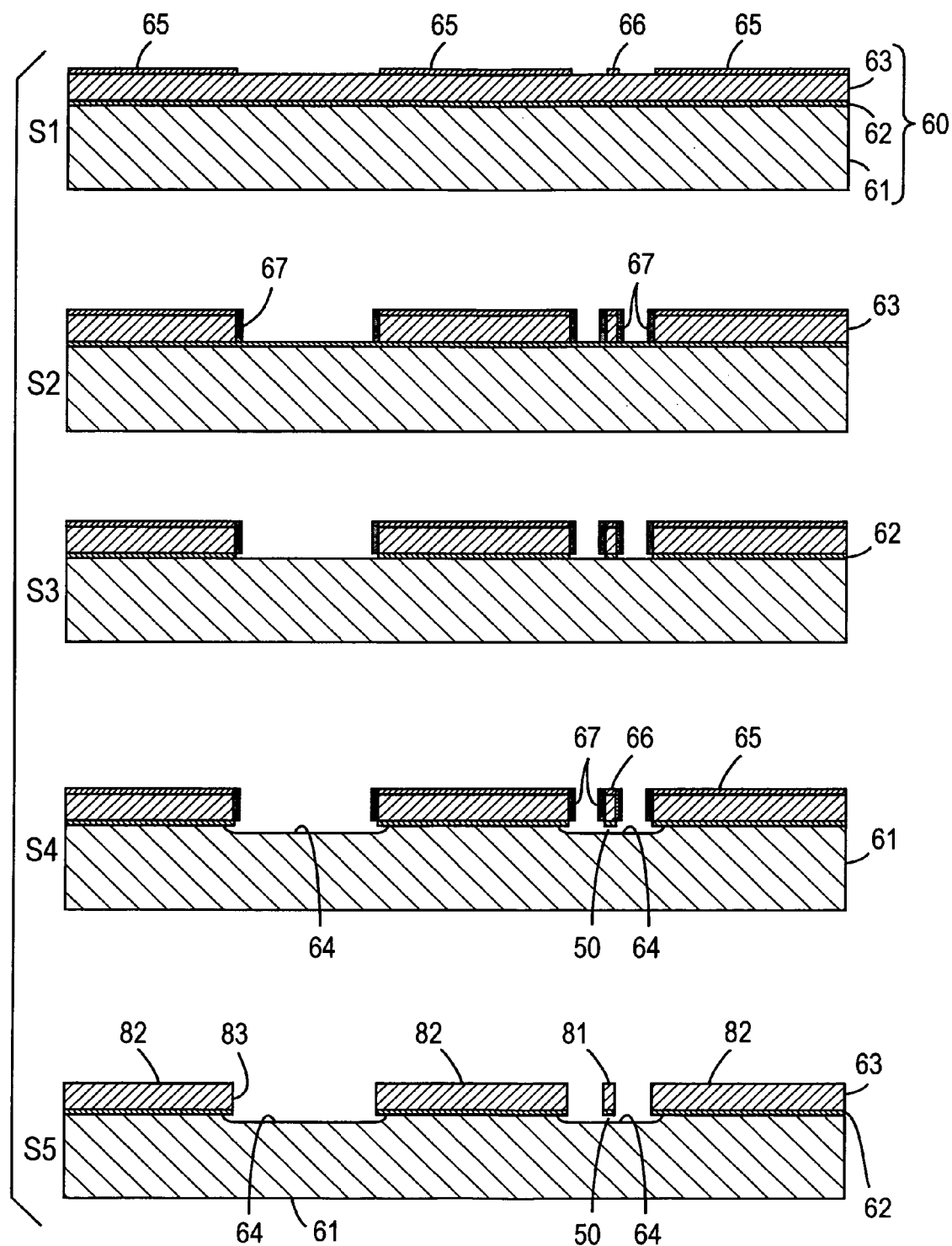
FIG. 7 illustrates a sequence of steps involved in the manufacture of the optical switch of the FIG. 3 embodiment.

Next, a description will be given of a method for manufacturing a microminiature moving device which has, on a single-crystal silicon substrate, movable elements displaceable in parallel to the substrate surface and stationary parts and elements and in which the movable elements are located above depressions formed in the substrate surface areas between adjacent stationary parts and elements. FIG. 7 schematically shows a sequence of steps S1 to S5 involved in the manufacture of the microminiature moving device as described below.

Step S1: A three-layered SOI substrate 60 is prepared first in which an insulating layer 62, formed by a silicon dioxide film, is sandwiched between a single-crystal silicon substrate 61 and a single-crystal silicon layer 63. The single-crystal silicon layer 63 is coated over the entire surface area thereof with a resist to form a mask layer, which is patterned by photolithography to form masks 66 for movable elements and masks 65 for stationary parts and elements that will ultimately be fixedly arranged on the single-crystal silicon substrate 61.

As shown in FIG. 3 that is a top plan view of the optical switch, the movable elements, that is, the movable rod 46, the mirror 47, the leaf-spring support members 48a to 48d, the support arms 49a, 49b and the movable comb electrodes 49, are each narrow or thin at least in one direction in the substrate surface; therefore, the masks 66 for the movable elements are generally narrow. In contrast thereto, the masks 65 for stationary parts or elements are wide.

Step S2: The single-crystal silicon layer 63 is selectively etched away down to the underlying insulating layer 62 by deep gas-reactive dry etching through the masks 65 and 66. This etching uses an ICP (Inductively Coupled Plasma)-RIE (Reactive Ion Etching) device. To enhance the verticality of sidewalls of the single-crystal silicon layer 63, it is preferable to utilize a vertical etch technique that involves alternate repetition of normal etching and polymer precipitation steps. This can be done by introducing into a plasma chamber of the ICP device a gas mixture of sulfur hexafluoride ($SF_6$) and argon (Ar) during etching and a mixture gas of octafluorocyclobutane ($C_4F_8$) and argon (Ar) during polymer precipitation.

In the etching of the single-crystal silicon layer 63 by alternately repeating the above two steps polymer layers are deposited on the sidewalls of the silicon layer 63 for each cycle of operation, and they are used intact as sidewall protective films 67.

Step S3: The exposed parts of the insulating layer 62 are etched away to expose the underlying surface areas of the single-crystal silicon substrate 61. This etching may be wet etching using an approximately 50% hydrofluoric acid (HF) solution, but in this case, dry etching using a mixture gas of trifluoromethane ($CHF_3$) and argon (Ar) is carried out by the RIE device.

Step S4: The exposed surface areas of the single-crystal silicon substrate 61 are subjected to isotropic etching. In this step, isotropic dry etching is carried out using a gas mixture of sulfur hexafluoride ($SF_6$) and argon (Ar).

Since the isotropic etching involves what is called "side etching," the time for etching is appropriately selected so that the single-crystal silicon underlying the wide portions composed of the single-crystal silicon layer 63 and the insulating layer 62, which will ultimately form the afore-mentioned stationary parts, is left unremoved, whereas the single-crystal silicon underlying the thin or narrow portions, which will ultimately form the afore-mentioned movable members, is completely removed. By such isotropic etching, the depressions 64 are formed in the top surface of the single-crystal silicon substrate 61, by which sufficient gaps 50 are made between the narrow portions and the single-crystal silicon substrate 61. In this instance, the depressions 64 somewhat get under the wide portions, too, but the wide portions are firmly fixed by the remaining single-crystal silicon to the single-crystal silicon substrate 61. The depressions 64 are formed to a depth of 10 µm or so, for instance.

Step S5: The masks 65, 66 and the sidewall protective films 67 are removed. Thus a structure is obtained in which stationary parts 82 are fixed on the single-crystal silicon substrate 61 through the insulating layer 62 and movable elements 81 are separated by the depressions 64 and consequently by the gaps 50 from the single-crystal silicon substrate 61. A groove 83 corresponds to the optical fiber receiving channel 42a (42b to 42d).

The masks 65 and 66 of the resist and the sidewall protective films 67 formed by the polymer precipitate can be removed simultaneously by $O_2$-plasma dry etching or by use of sulfuric acid ($H_2SO_4$).

When a required film needs to be formed on the sidewall of each moving element 81 or stationary part as in the case of forming a reflecting film on either side of the mirror 47 of the optical switch shown in FIG. 3, the film formation is performed at the end of the manufacturing process.

With such a manufacturing method as described above, the SOI substrate 60 is commercially available as in the prior art.

In this case, however, the intermediate insulating layer 62 of the three-layered substrate structure is not removed to form the movable elements as in the prior art, but instead it is used to stop or limit etching of the overlying single-crystal silicon layer 63 and for electrical insulation.

Since the etching for the formation of the depressions 64 in the top surface of the single-crystal silicon substrate 61 in step S4 needs only to be essentially isotropic etching, the etching is not limited specifically to the above-mentioned dry etching but may also be wet etching using nitric-hydrofluoric acid as an etchant. However, when the etching of the insulating layer 62 in step S3 and the etching of the single-crystal silicon in step S4 are conducted by dry etching using the RIE device, these two steps can be successively performed only by replacing the gas for etching in step S3 with the gas for etching in step 4—this permits simplification of the manufacturing device and process.

Furthermore, utilization of the polymer precipitation layer is the most advantageous to the formation of the sidewall protective films 67 in step S2, but it is also possible to form the sidewall protective films 67 by evaporating silicon dioxide on the sidewalls or exposing them to high-temperature water vapor to thermally oxidize the sidewalls to form thereon oxide films after anisotropic etching of the single-crystal silicon layer 63.

In this instance, however, since the sidewall protective films 67 are the same silicon dioxide films as the intermediated insulating layer 62 of the SOI substrate 60, it is necessary to selectively remove only the exposed regions of the insulating layer 62 except the sidewall protective films 67 in step S3. This can be done in such a manner as described below.

A pair of parallel-plate electrodes is provided in the RIE device and the substrate 60 subjected to etching in step S2 in FIG. 7 is placed between the parallel-plate electrodes with the substrate surface held in parallel thereto. Then a reactive gas containing trifluoromethane ($CHF_3$) or the like is supplied into the plasma chamber of the RIE device to accelerate ions among particles in plasma by a DC electric field created by ion sheaths in the electrode surfaces, conducting a high-energy ion bombardment of the exposed surfaces of the insulating layer 62 on the bottoms of the etched grooves to thereby trigger an ion assisted chemical reaction. As a result, etching takes place only in the direction of incidence of ions—this ensures effective removal of the exposed regions of insulating layer 62 alone, leaving the sidewall protective films 67 unremoved.

Incidentally, hydrofluoric acid is used for such removal of the sidewall protective films 67 of silicon dioxide as described above. In this case, the sidewall protective films 67 on the vertical sidewalls of the etched grooves and the insulating layer 62 underlying the movable element 81 are simultaneously removed, but removable of the sidewall protective films 67 is so rapidly that lateral etching of the insulating layer 62 is slight and hence does not matter.

In the above example, the movable element 81 and marginal portions of the stationary parts 82 overhanging the depressions 64 are each formed by the single-crystal silicon layer 63 and the insulating layer 62 as shown in step S5 in FIG. 7. In particular, the overhanging portions of the stationary part 82 are also covered on the underside thereof with the insulating layer 62, which prevents electrical shorting of the single-crystal silicon layer 63 and the single-crystal silicon substrate 61 via conductive foreign bodies even if they get into gaps under the overhanging portions.

However, in the case where each depression 64 is formed approximately 10 μm deep and the insulating layer (3 μm thick, for instance) on the underside of the overhanging portion is also removed, the total depth of the depression 64 down to its bottom from the underside of the stationary part 82 is approximately 13 μm or so. For example, in an environment in which the entry itself of a foreign body of a size large enough to make a short-circuit in such a wide gap is very unlikely to occur, the wide gap fully serves the object of preventing the occurrence of shorting, eliminating the need for forming the insulating layer on the underside of the overhanging marginal portion of the stationary part.

For example, in the case of making the movable element 81 more flexible, or in the case of encountering the problem of a stress or the like developing in the interface of the two-layered structure of the movable element 81, the insulating layer 62 underlying the movable element 81 and the overhanging marginal portion of the stationary part 82 may be removed using hydrofluoric acid in step S5.

Incidentally, in the above-described example, the depressions 64 are formed not only beneath movable elements 81 but also between adjacent stationary part 82, that is, the depressions 64 are formed in those surface areas of the single-crystal silicon substrate 61 where the stationary parts 82 are not formed. Accordingly, the depressions 64 are also formed in the optical fiber receiving channels 42a to 42d where to receive the optical fibers 71a to 71d.

In general, it is not easy to control with high accuracy the depth of every depression 64 that are formed by etching, and when the plurality of depressions 64 are present in the single-crystal silicon substrate 61, too, it is not easy to form the depressions 64 to the same depth.

For the reasons given above, the optical fibers 71a to 71d placed on such depressions 64 are inevitably poor in the accuracy of height and hence vary in height, incurring the possibility of degrading the light coupling efficiency by a misalignment of their optical axes.

Embodiment 2

Next, a description will be given of a second embodiment of the present invention which is intended to obviate the above-mentioned problems, that is, which is configured to place parts in position with a high degree of accuracy of height.

Figure 8:
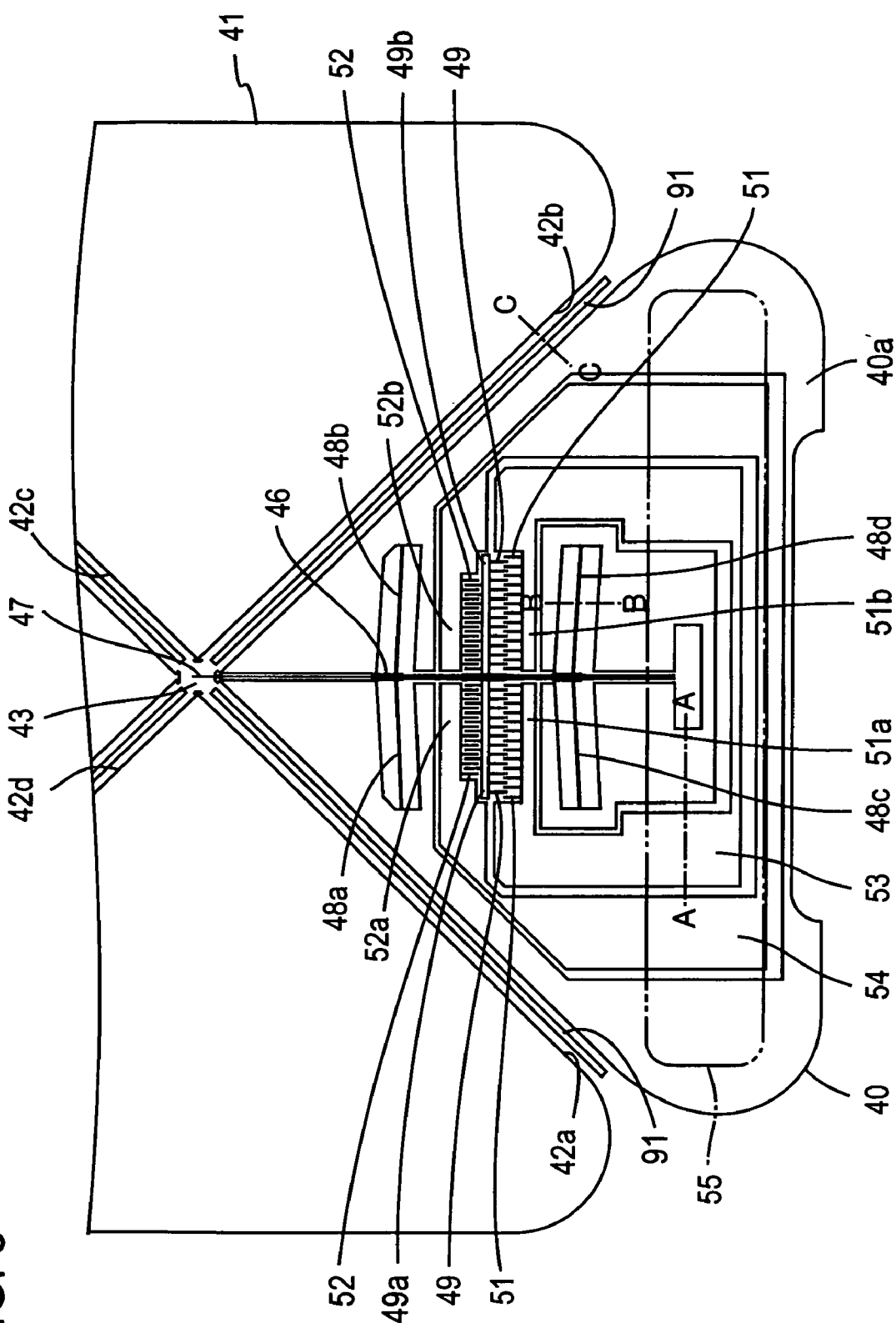
FIG. 8 is a top plan view illustrating an optical switch according to a second embodiment of the present invention.
Figure 9A:
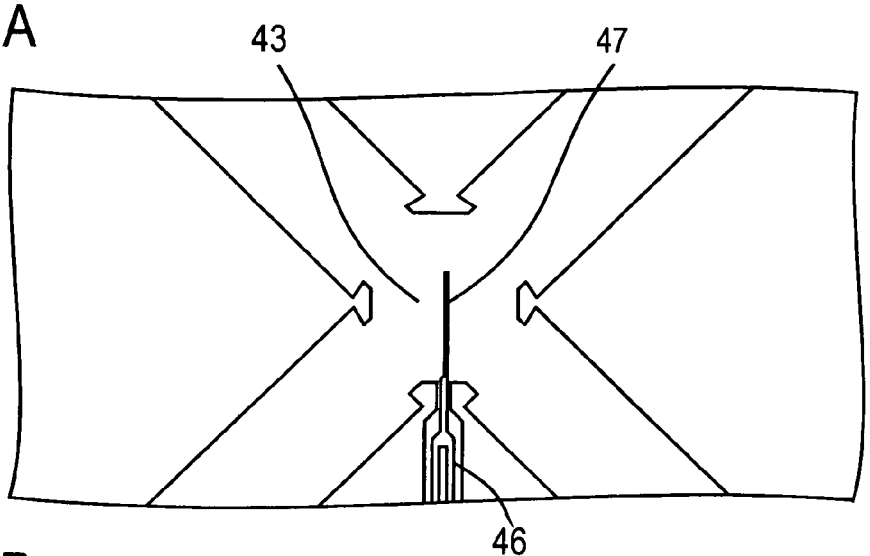
FIG. 9A is an enlarged plan view showing in detail the intersection of the fiber insertion channels of the optical switch of the FIG. 8 embodiment.
Figure 9B:
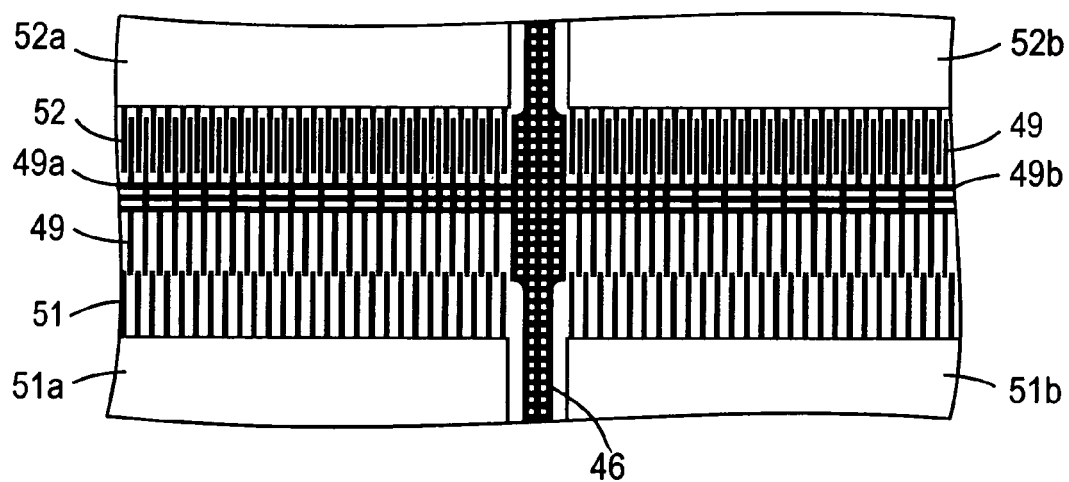
FIG. 9B is an enlarged plan view showing in detail an electrostatic actuator of the optical switch of the FIG. 8 embodiment.
Figure 10A:
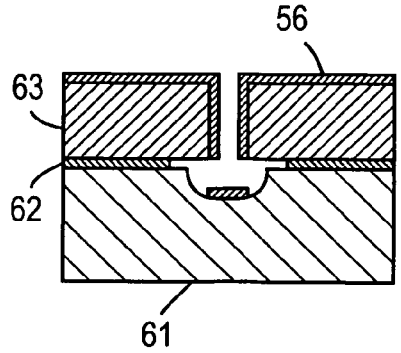
FIG. 10A is a cross-sectional view taken along the line A-A in FIG. 8.
Figure 10B:
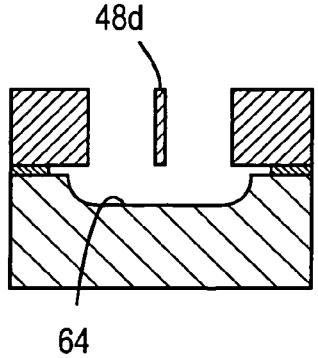
FIG. 10B is a cross-sectional view taken along the line B-B in FIG. 8.
Figure 10C:
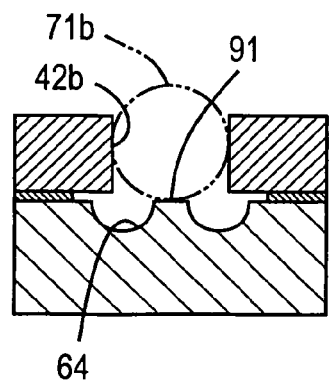
FIG. 10C is a cross-sectional view taken along the line C-C in FIG. 8.

FIG. 8 is a top plan view exemplifying, as an optical switch, the microminiature moving device of such a configuration. FIGS. 9A and 9B are its partial enlarged views. FIGS. 10A to 10C are sectional views taken on the lines A-A, B-B and C-C in FIG. 8, respectively. The parts corresponding to those in FIGS. 3 and 4A to 4C are identified by the same reference numerals, and their detailed description will not be repeated.

In this embodiment, as shown in FIG. 10C, a placement guide 91 is provided in the depression 64 of each of the optical fiber receiving channels 42a to 42d, and the optical fibers 71a to 71d are each disposed on the placement guide 91. The placement guides 91 are each formed by the surface layer of the single-crystal silicon substrate 61 left unetched in the depression 64, and the placement guides 91 are so high in surface accuracy that the optical fibers 71a to 71d can be held at the same height with high accuracy. The height of the mirror 47 formed by the single-crystal silicon layer 63 relative to the optical fibers 71a to 71d can also be controlled with high accuracy because both the mirror 47 and the optical fibers 71a to 71d can be controlled in height with reference to the top surface of the single-crystal silicon substrate 61.

In this embodiment, as depicted in FIG. 8, there are formed conductive paths 53 and 54 that connected to the stationary parts 51a, 51b of the first stationary comb electrodes 51 and the stationary parts 52a, 52b of the second stationary comb electrodes 52, respectively and extended to the marginal areas (indicated by the two-dot chain lines in FIG. 8) of the actuator forming area 40. The marginal portion (indicated by the two-dot chain lines in FIG. 8) of the actuator forming area 40 across the conductive paths 53 and 54 is used as an electrode pad forming area 55, in which there is formed an electrode pad 56 as shown in FIG. 10A. The electrode pad 56 is, for example, an Au/Pt/Ti film using a Ti film as the base, which is formed by sputtering.

Figure 11A:
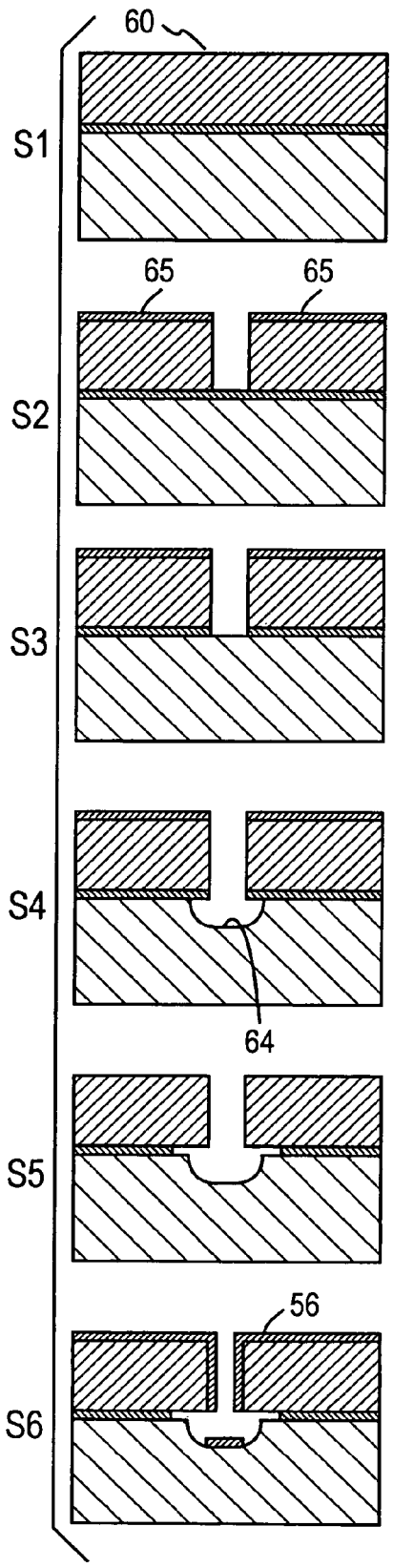
FIG. 11A shows, in cross-section along the line A-A in FIG. 8, a sequence of steps involved in an example of the method for manufacturing the optical switch of FIG. 8.
Figure 11B:
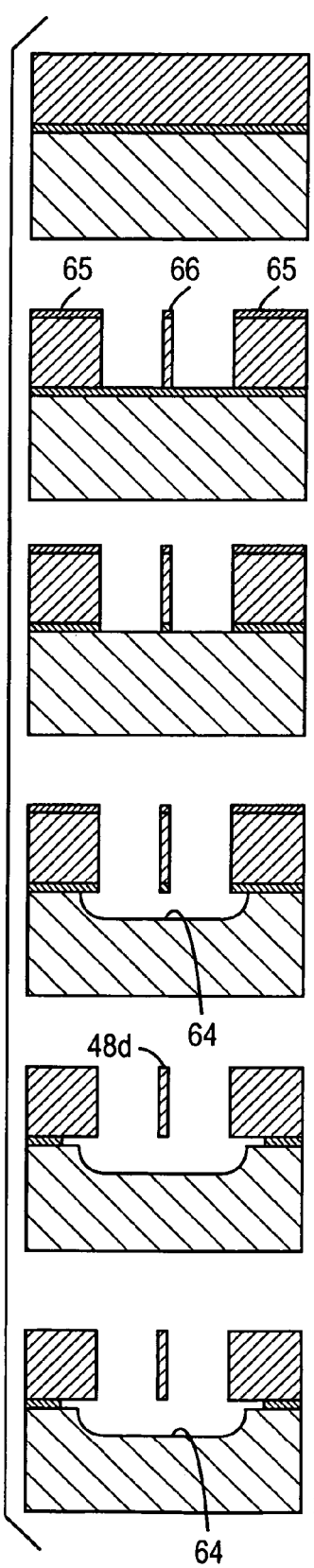
FIG. 11B shows, in cross-section along the line B-B in FIG. 8, the sequence of steps involved in the optical switch manufacturing method.
Figure 11C:
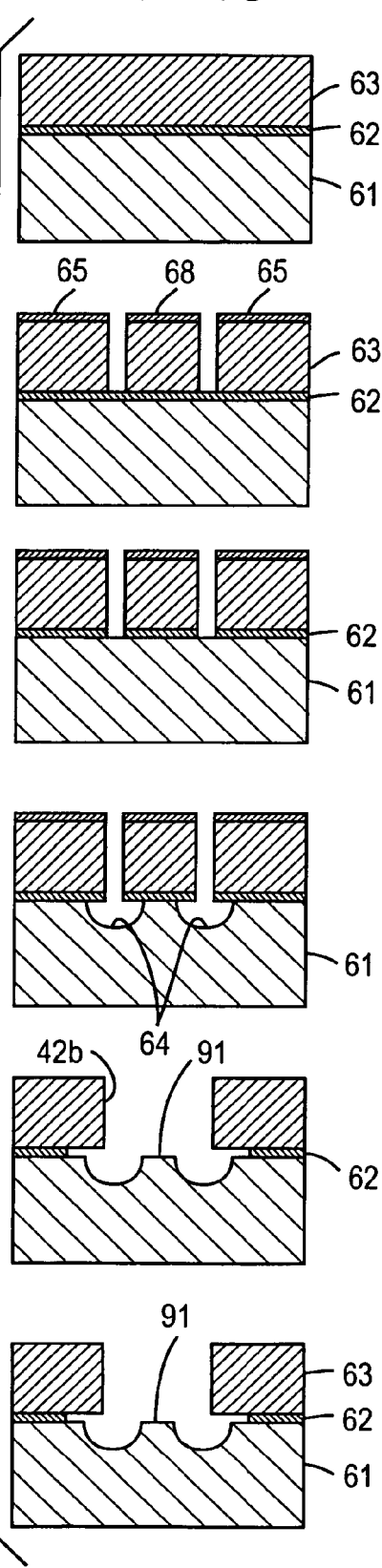
FIG. 11C shows, in cross-section along the line C-C in FIG. 8, the sequence of steps involved in the optical switch manufacturing method.

FIGS. 11A to 11C schematically show steps S1 to S6 involved in the manufacture of the optical switch of the above-described configuration. FIGS. 11A to 11C show the steps in the cross-sections along the lines A-A, B-B and C-C in FIG. 8, respectively. A description will be given of steps S1 to S6.

Step S1: The SOI substrate 60 is prepared.

Step S2: A resist is coated all over the top surface of the single-crystal silicon layer 63 to form a mask layer, which is subjected to patterning by photolithography to form the masks 65 for the stationary parts to be fixedly disposed on the single-crystal silicon substrate 61 and the masks 66 for the movable elements. At the same time, masks 68 for the placement guides are also formed.

In decreasing order of size of the narrowest portion of their pattern, the mask 65 for the stationary part comes first, followed by the mask 68 for the placement guide and then by the mask 66 for the movable element.

Figure 12A:
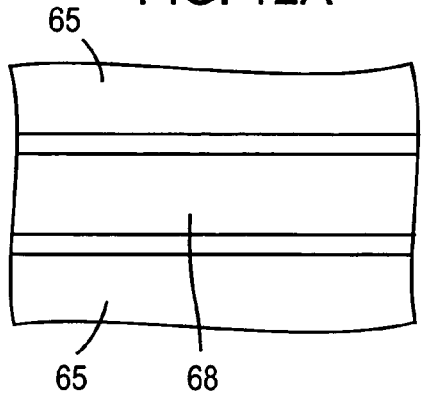
FIG. 12A is an enlarged plan view showing an example of a mask pattern for a placement guide that is provided in an optical fiber receiving channel in FIG. 11C.
Figure 12B:
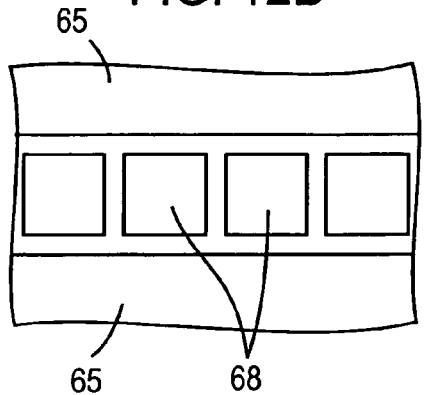
FIG. 12B is an enlarged plan view showing another example of a mask pattern for a placement guide that is provided in the optical fiber receiving channel in FIG. 11C.

The mask 68 for the placement guide may be of a continuous pattern extending lengthwise of the optical fiber receiving channel as depicted in FIG. 12A, or of a discontinuous pattern as shown in FIG. 12B. In the latter case, since a depressions is formed in the top surface of the single-crystal silicon substrate 61 between adjacent island-shaped regions in step S4 as described later, an adhesive can be injected under the optical fiber through the depression to increase the fiber fixing strength.

Then the single-crystal silicon layer 63 is selectively etched away by deep gas-reactive dry etching through the masks 65, 66 and 68 until the insulating layer 62 is exposed. In this case, too, though not shown in FIGS. 11A to 11C, films are deposited on exposed sidewalls of the single-crystal silicon layer 63 to form the sidewall protective films in the same manner as described previously with reference to step S2 in FIG. 7.

Step S3: The exposed regions of the insulating layer 62 are etched away down to the single-crystal silicon substrate 61.

Step S4: The exposed surface regions of the single-crystal silicon substrate 61 are etched away by isotropic etching until it is removed from under the thin or narrow portion of single-crystal silicon that will ultimately form a movable element. As a result, the depressions 64 are formed. The etching in steps S3 and S4 may be wet etching, but the use of dry etching is advantageous since steps S2 to S4 can be performed successively in the same etching device.

Step S5: The masks 65, 66, 68 and the sidewall protective films are removed, after which the insulating layer 62 is etched away until that part of the insulating layer 62 overlying the surface region of the single-crystal silicon substrate 61 that will ultimately form the placement guide 91 is removed, with the result that the single-crystal silicon layer 63 overlying the placement guide 91 is removed.

Step S6: An Au/Pt/Ti film is formed by sputtering through a mechanical mask in each of the electrode pad forming area 55 and a mirror 47 area. Thus th optical switch of FIG. 8 is completed.

For example, when the optical fiber receiving channels 42a to 42d are hundred-odd μm wide, the width of the placement guide 91 is on the order of 50 μm. In this instance, assuming that the depression 64 is 10 μm deep, the width of the mask 68 for the placement guide 91 is 70 μm since the isotropic etching for the formation of the depression 64 proceeds at the same rate both in horizontal and in vertical direction.

When the mask 68 for the placement guide 91 is formed in such a one-piece continuous pattern as shown in FIG. 12A, the depression 64 in the optical fiber receiving channel is divided into two extending lengthwise of the channel, whereas when the mask 68 is formed in the discontinuous or discrete island pattern as shown in FIG. 12B, the afore-mentioned advantage of providing increased fiber fixing strength is obtained; furthermore, separated island regions allow the two depressions 64 to communicate with each other—this facilitate a smooth flow of an UV hardening adhesive or the like that is injected under the optical fiber disposed in the fiber receiving channel, making it possible for the adhesive to immediately reach a uniform level throughout the optical fiber receiving channel.

Such a placement guide 91 may be surrounded by stationary parts, that is, by the depressions 64, and at the marginal edges of the substrate it may have marginal edges not surrounded by the depressions 64 and the stationary parts as in the example of the optical fiber receiving channel.

The placement guide 91 is used to support the optical fiber as in this embodiment, and it is also used to support a chip element such as a lens, semiconductor light-emitting element or semiconductor optical modulator. In the case of supporting the chip element, a metal layer as an electrode pad is formed on the surface the placement guide 91 simultaneously with the formation of electrode pads on other portions.

The provision of the depression 64 overcomes the problem of malfunction of the movable element or electrical shorting which is caused by foreign bodies as described previously. Now, a description will be given of shorting by condensation, that is, dews (which are included as foreign bodies in a broad sense).

Figure 13A:
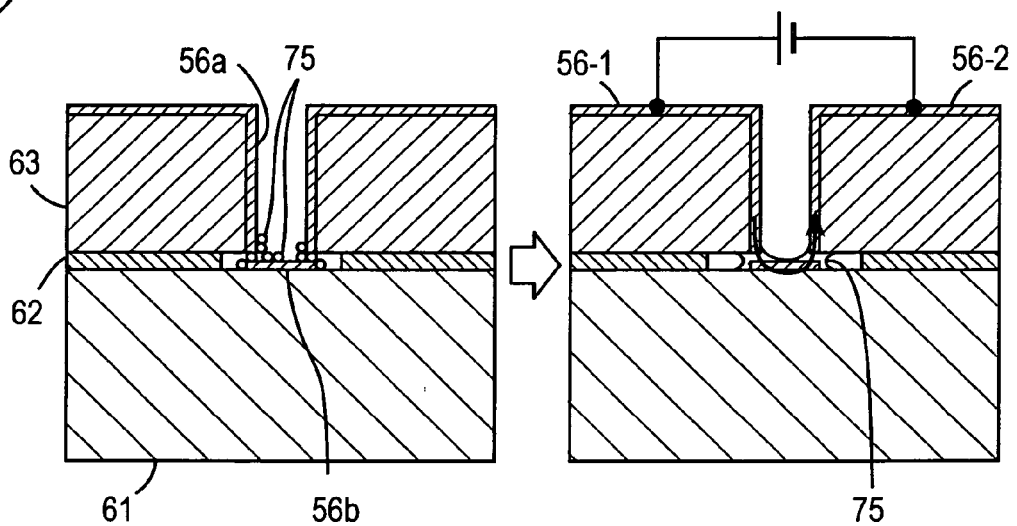
FIG. 13A shows, in cross-section, how condensation occurs in the case where no depression is formed in the top of the single-crystal silicon substrate (prior art example)

FIG. 13A shows, for the purpose of comparison, how condensation occurs in a prior art example in which no depression 64 is formed. Reference numeral 75 denotes dews. The dews 75 tend to form in the vicinity of the boundary between silicon and metal (gold (Au)). In the film formation for the electrode pad 56 by use of a mechanical mask, since metal layers 56a and 56b are formed on the exposed surface of the single-crystal silicon substrate 61 as well on the sidewalls of the single-crystal silicon layer 63, the dews 75 form as depicted in FIG. 13A, causing shorting of electrode pads 56-1 and 56-2.

Figure 13B:
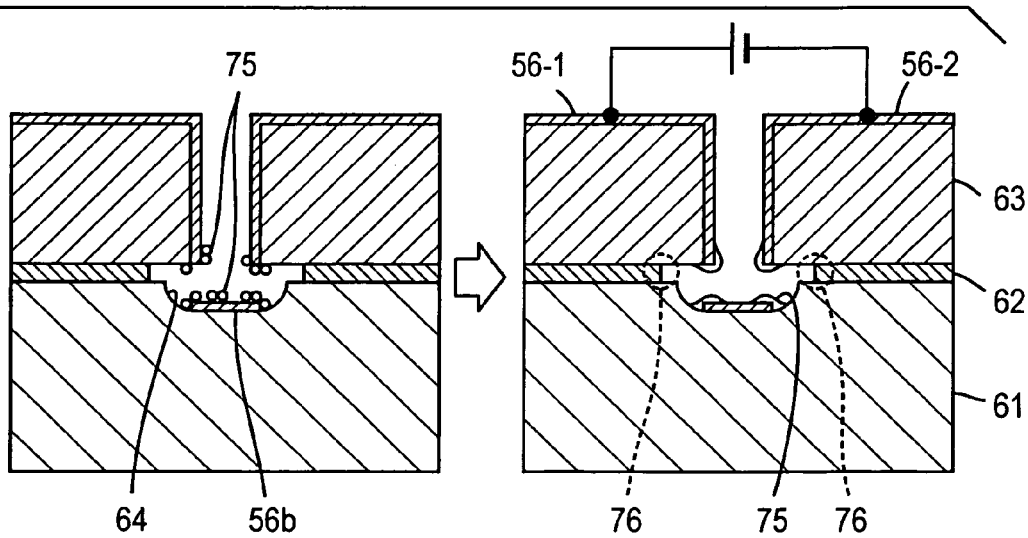
FIG. 13B shows, in cross-section along the line A-A in FIG. 8, how condensation occurs in the case where a depression is formed of the single-crystal silicon substrate.

FIG. 13B shows the dews 75 that form in the depression 64, from which it can be seen that the depression 64 serves to prevent shorting by condensation.

Incidentally, not only the optical switch but also this kind of microminiature moving devices manufactured using the SOI substrate are usually put in a package, but a completely sealed package structure is hard to obtain in practice; water vapor gradually enters the package with the lapse of time, and a change in the temperature environment can cause condensation on the device surface.

Next, a description will be given of another method for the manufacture of the optical switch shown in FIG. 8. FIGS. 14A to 14C schematically shows, as is the case with FIGS. 11A to 11C, a sequence of steps S1 to S6 involved in the method for manufacturing the optical switch according to this example.

Step S1: The SOI substrate 60 is prepared.

Step S2: A silicon dioxide film is formed over the entire surface area of the single-crystal silicon layer 63, then the silicon dioxide film is subjected to patterning by photolithography to form the masks 65 for the stationary parts, the masks 66 for the movable elements and the masks 68 for the placement guides as in the case of step S2 in FIGS. 11A to 11C. The silicon dioxide film forming the mask layer is formed thicker than the insulating layer 62 similarly formed of silicon dioxide.

Then the single-crystal silicon layer 63 is selectively etched away by deep gas-reactive dry etching through the masks 65, 66 and 68 until the insulating layer 62 is exposed. In this case, too, the sidewall protective films are formed on the exposed sidewalls of the single-crystal silicon layer 63, though not shown in FIGS. 14A to 14C.

Step S3: The exposed regions of the insulating layer 62 are etched away down to the single-crystal silicon substrate 61. In this step the masks 65, 66 and 68 are also subjected to etching but not completely etched away and remain unremoved since they are thicker than the insulating layer 62.

Step S4: The exposed surface regions of the single-crystal silicon substrate 61 are etched away by isotropic etching as in the case of step S4 in FIGS. 11A to 11C.

Step S5: The sidewall protective films are removed, after which the insulating layer 62 is etched away in the same manner as in step S5 in FIGS. 11A to 11C, with the result that the single-crystal silicon layer 63 overlying the placement guide 91 is removed. At the same time, the masks 65, 66 and 68 are also etched away.

Step S6: An Au/Pt/Ti film is formed by sputtering through a mechanical mask in each of the electrode pad forming area 55 and a mirror 47 area. Thus the optical switch of FIG. 8 is completed.

The above manufacturing method uses the silicon dioxide film to form the masks 65, 66 and 68 instead of using the resist. The use of the silicon dioxide film involves a step of its patterning, but the silicon dioxide film is more resistant to dry etching than the resist and hence is highly reliable.

In the two manufacturing method described above with reference to FIGS. 11A to 11C and FIGS. 14A to 14C, the films (polymer precipitation layers) deposited on the exposed sidewalls of the single-crystal silicon layer 63 during gas-reactive dry etching in step S2 are used as sidewall protective films during etching in step S4, but in the method of FIGS. 14A to 14C the sidewall protective films can be rendered into silicon dioxide films by conducting thermal oxidation after step S2.

The sidewall protective film formed by the silicon dioxide film provide the advantages listed below.

a) The silicon dioxide film as the protective film during etching of the single-crystal silicon substrate 61 is more reliable than the polymer precipitation layer).

b) When a smooth vertical surface (sidewall surface) such as a mirror surface is required to obtain, planarization of the vertical surface in the step of forming the dioxide film produces a subsidiary effect.

c) Since the desired polymer precipitation layer need not be formed and left unremoved, it is possible to increase process-wide flexibility such as alternate repetition of etching and polymer precipitation steps in the deep gas-reactive dry etching.

In the manufacturing methods of FIGS. 11A to 11C and FIGS. 14A to 14C, the single-crystal silicon layer 63 overlying the placement guide 91 can be removed simultaneously with the etching of the insulating layer 62 in step S5, but marginal portions of the insulating layer 62 underlying the stationary part is also etched away to form slight gaps between the single-crystal silicon substrate 61 and the single-crystal silicon layer 63 as indicated by the broken lines 76 in FIG. 13B.

In this case, the dews 75 may sometimes be trapped in the gaps, and other foreign objects are also likely to get into the gaps—this incurs the possibility of shorting of the single-crystal silicon substrate 61 and the single-crystal silicon layer 63. Steps S5, S5', S5'' and S6 in FIGS. 15A to 15C show how to prevent shorting that would result from the presence of such slight gaps. The steps will be described below.

Steps S1 to S5 are performed in the same manner as steps S1 to S5 in FIGS. 11A to 11C or FIGS. 14A to 14C.

Step S5': The exposed surface areas of the single-crystal silicon layer 63 and the single-crystal silicon substrate 61 are thermally oxidized to form silicon dioxide film 69.

Step S5'': The silicon dioxide film 69 on the single-crystal silicon layer 63 in the electrode pad forming area 55 is patterned to form windows 70 for conduction.

Step S6: An Au/Pt/Ti film is formed by sputtering in each of the electrode pad forming area 55 and the mirror (47) forming area.

The formation of the silicon dioxide film 69 by thermal oxidation in the above steps ensures prevention of shorting in the above-mentioned gaps.

According to the first embodiment of the present invention described above as being applied to the optical switch, the provision of the depressions 64 excludes the possibility of shorting and malfunction of movable elements, and the provision of the placement guides 91 by the unremoved surface regions of the single-crystal silicon substrate 61 in the depressions 64 permits high-accuracy placement of parts. While in the above the depressions 94 and the placement guides 91 are formed by isotropic etching of single-crystal silicon, they can also be formed by anisotropic etching of single-crystal silicon.

Embodiment 3

Next, a description will be given of a device structure that has such depressions and placement guides formed by anisotropic etching of single-crystal silicon, and a method of manufacturing the device.

Figure 16:
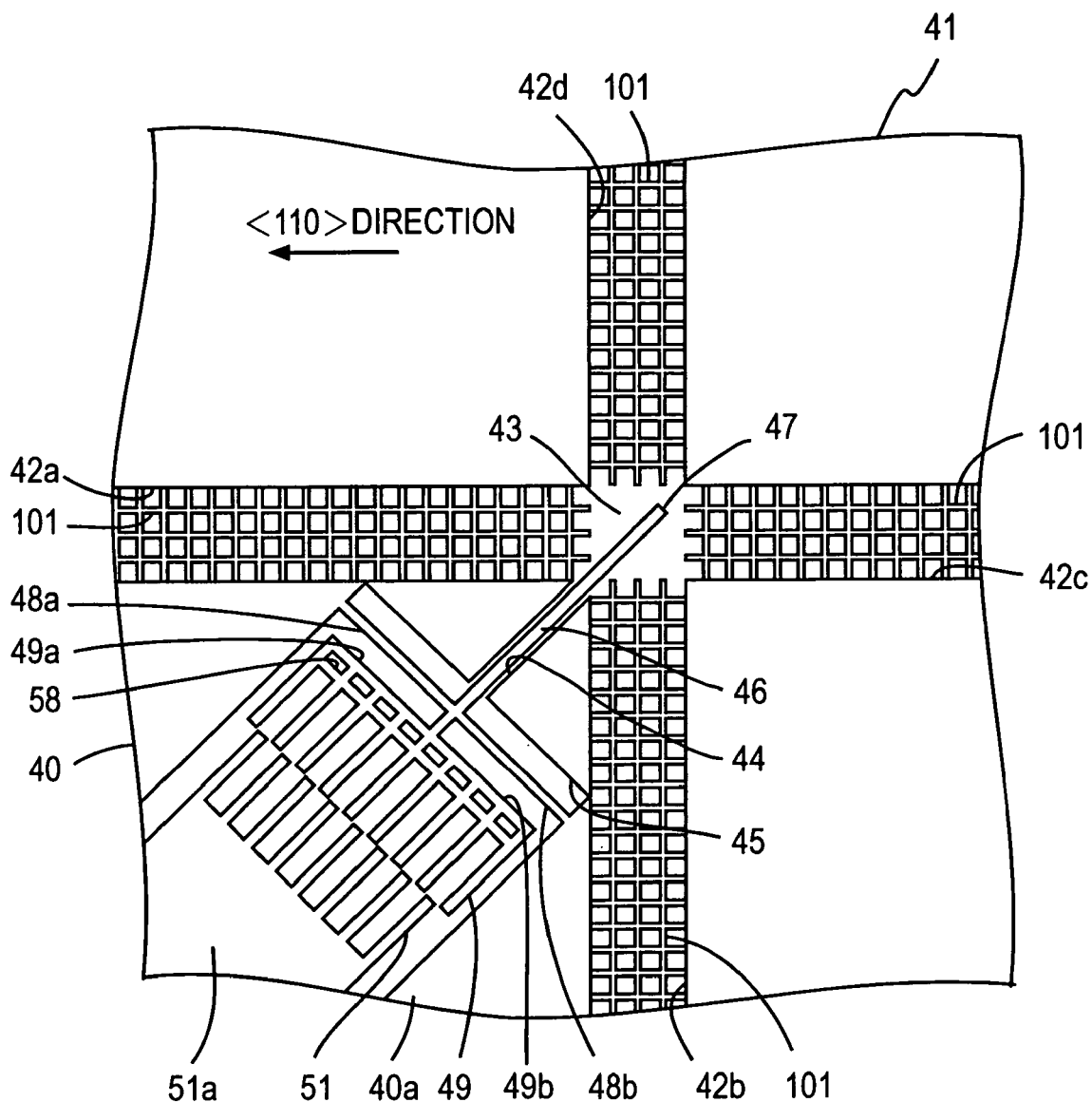
FIG. 16 is a top plan view illustrating an optical switch according to a third embodiment of the present invention.

FIG. 16 illustrates an optical switch as a microminiature moving device of the above-mentioned structure. The parts corresponding to those in the optical switch of FIG. 3 are identified by the same reference numerals, and no detailed description will be repeated.

In this embodiment, the optical switch is fabricated using the SOI substrate 60 in which the insulating layer 62, formed by a silicon dioxide film, is sandwiched between the single-crystal silicon substrate 61, whose top surface forms in the (100) plane, and the single-crystal silicon layer 63. The four optical fiber receiving channels 42a to 42d are formed along the <100> crystal direction of the single-crystal silicon substrate 61.

On the other hand, the mirror 47, the movable rod 46, the leaf-spring-like support members 48a, 48b, the support arms 49a, 49b, and the movable comb electrode 49, which form the movable part, are formed mainly using lines that are not parallel to the <100> direction, and the movable rod 46 is supported, in this embodiment, by the pair of leaf-spring-like support members 48a and 48b. In the thick portion of the movable part there are made bores or hollows 58 using the line not parallel to the <110> direction. In detailed outside shapes, however, they may partly contain lines parallel to the <110> direction.

The electrostatic actuator in this embodiment is composed of a pair of movable comb electrode 49 and stationary comb electrode 51. The stationary comb electrode 51, the slot 44 receiving the movable rod 46 and the recess 45 contiguous to the slot 44 are also formed mainly using lines not parallel to the <110> direction. In this embodiment, the mirror 47 is initially held at the intersection area 43, and by applying voltage across the movable comb electrode 49 and the stationary comb electrode 51, the mirror 47 is pulled out of the intersection area 43 and it is held in its retracted position during the voltage application.

In each of the optical fiber receiving channels 42a to 42d there are formed a placement guides 101 by the unremoved surface regions of the single-crystal silicon substrate 61. The placement guides 101 in this example are patterned in matrix or lattice form in the <110> direction of the single-crystal silicon substrate 61. The optical fibers are each placed on the placement guides 101 arranged in such a matrix or lattice form.

Figure 1:
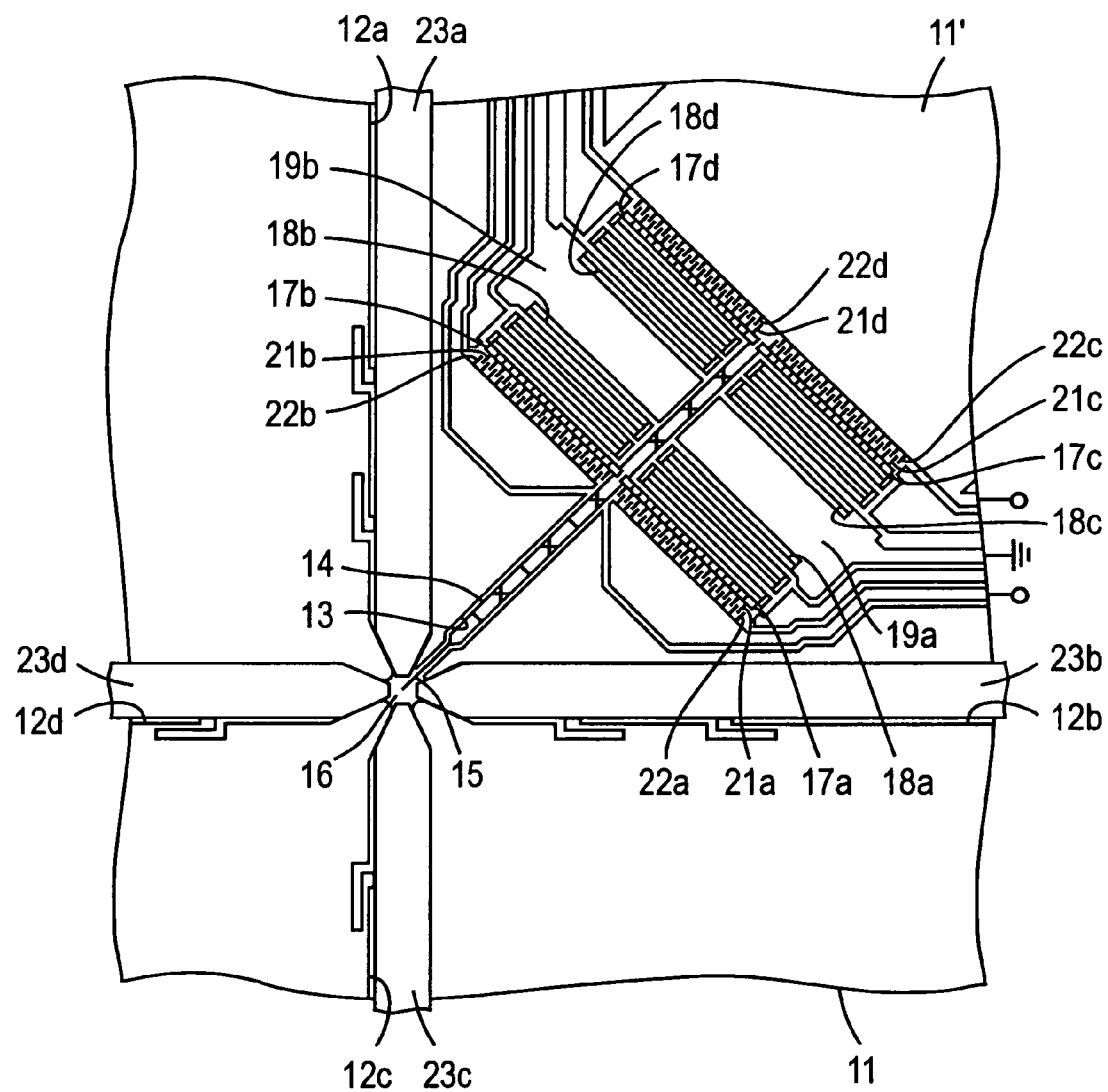
FIG. 1 is a plan view showing a conventional optical switch as an example of a microminiature moving device.
Figure 2:
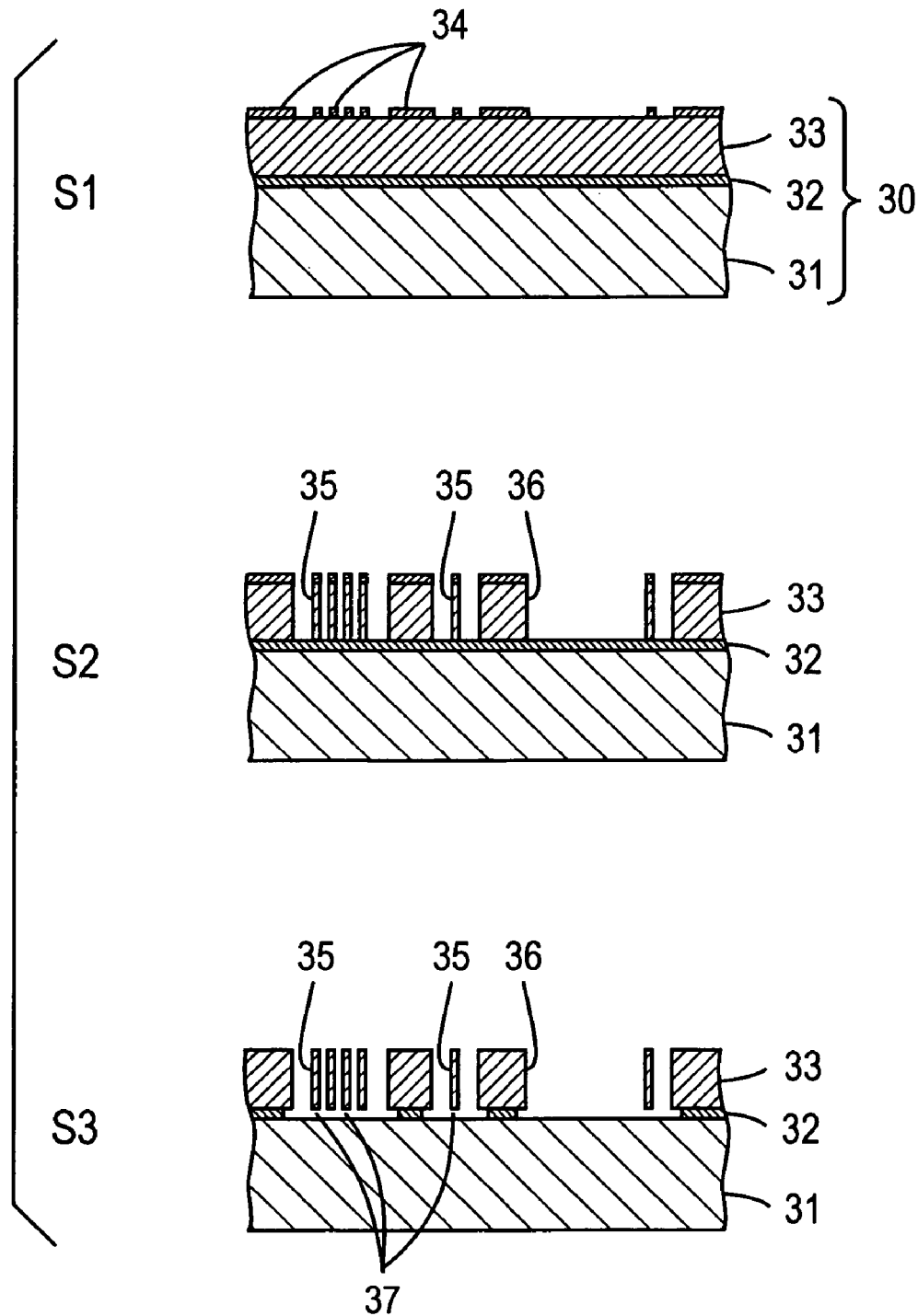
FIG. 2 schematically shows a sequence of steps involved in the manufacture of the conventional optical switch depicted in FIG. 1.
Figures 1, 17:
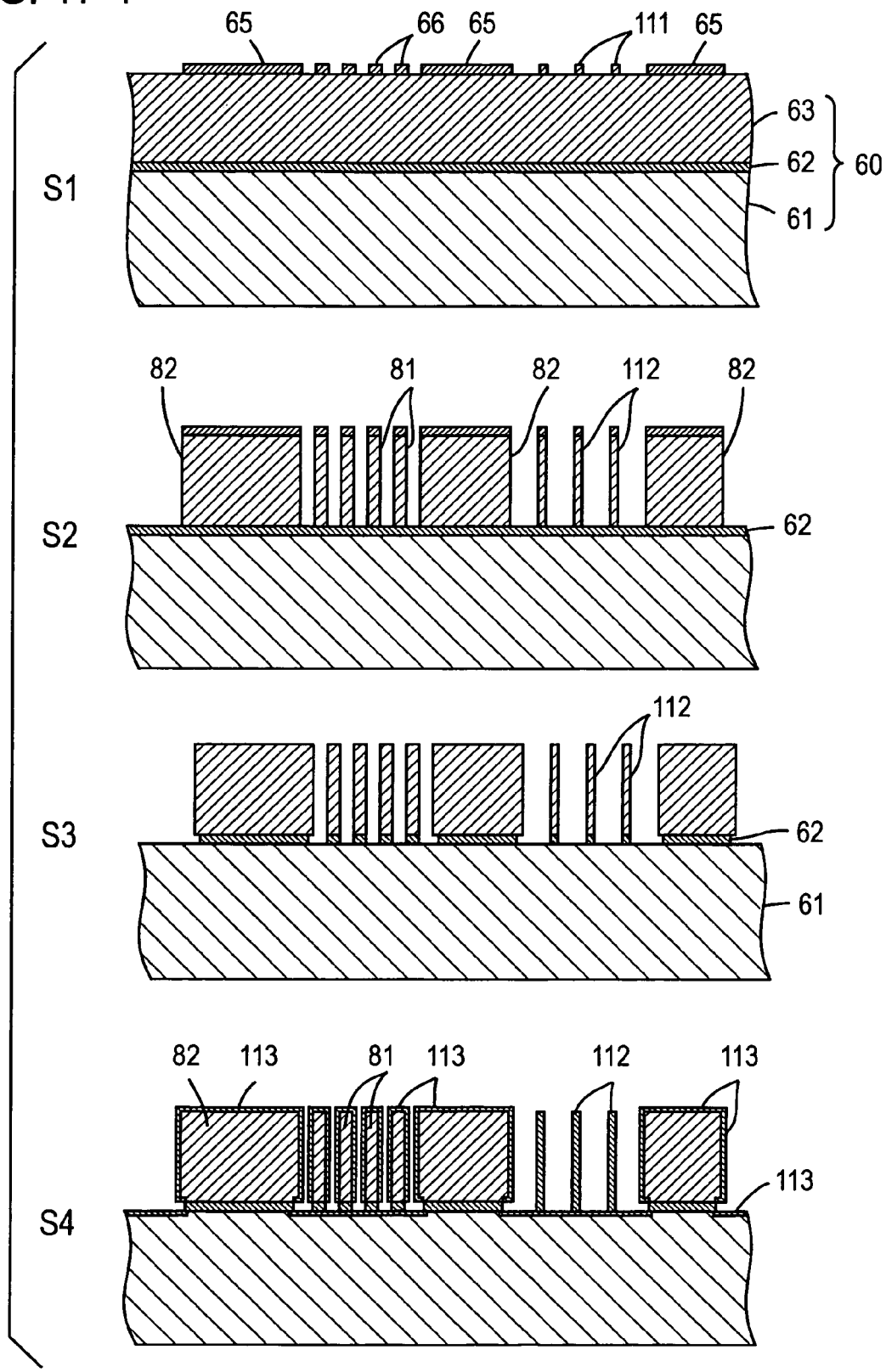
Figures 2, 17:
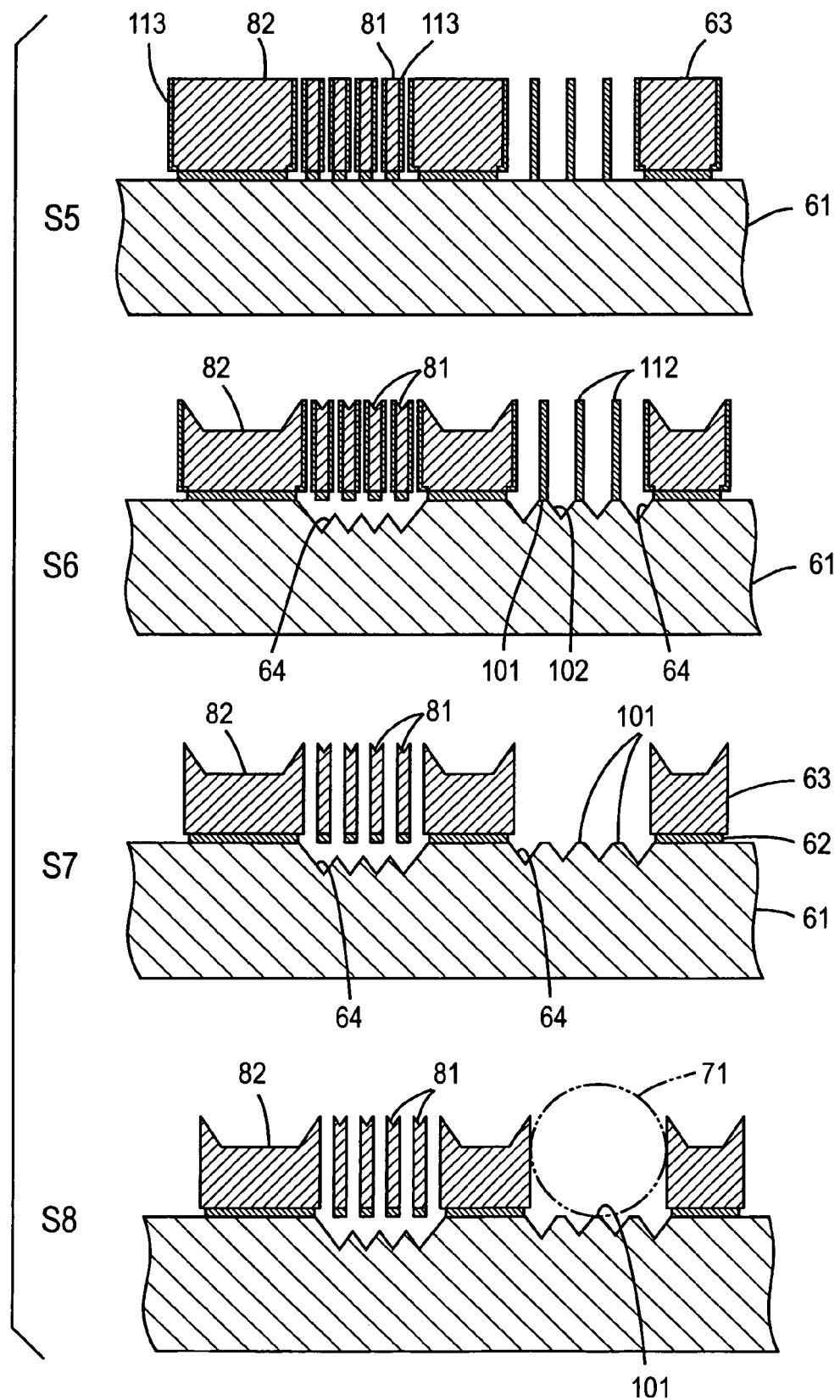

FIGS. 17-1 and 17-2 schematically show steps S1 to S8 involved in the manufacture of the optical switch of the above-described construction.

Step S1: The SOI substrate 60 is prepared which has the insulating layer 62 sandwiched between the single-crystal silicon substrate 61 whose top surface forms the (100) plane and the single-crystal silicon layer 63. The top surface of the single-crystal silicon layer 63 is oxidized to form a silicon dioxide film as a mask layer, which is subjected to patterning by photolithography to form the masks 65 for stationary parts, masks 66 for movable elements and masks 111 for placement guides.

The outside shape of each mask 111 is defined by lines parallel to the <110> direction of the single-crystal silicon substrate 61, whereas the outside shape of each mask 66 is defined mainly lines not parallel to the <110> direction. The masks 111 for the placement guides are formed narrower than the other masks. Concretely, the masks 111 are around 1 to 2 µm wide and arranged in matrix form, but the masks 111 are designed to be greater in width than the thickness of the insulating layer 62.

Step S2: The single-crystal silicon layer 63 is etched away by deep gas-reactive dry etching through the masks 65, 66 and 111 until the underlying insulating layer 62 is exposed. As a result, movable elements 81 and stationary parts 82 are formed, and narrow filigree structures 112 are formed underlying the masks 111 for the placement guides.

Step S3: The exposed regions of the insulating layer 62 are etched away to expose the top surface of the single-crystal silicon substrate 61. This etching is carried out using an aqueous solution of hydrofluoric acid and for a short period of time. For example, in the case of using an aqueous solution containing 50 wt % of hydrofluoric acid, the etching time is approximately 3 minutes. In this instance, the etching time is so selected as not to be too long enough to completely remove the insulating layer 62 underlying the narrow filigree structures 112. This step is performed to minimize the removal of oxide films by RIE in step S5 described later on, and at the same time, the masks 65, 66 and 111 formed by the silicon dioxide films are etched away.

Step S4: The single-crystal silicon layer 63 and the single-crystal substrate 61 are subjected to thermal oxidation. The amount of oxidation is selected larger than a value for oxidizing the narrow filigree structures 112 in their entirety. As a result, thermally oxidized films 113 are formed all over the exposed areas of the single-crystal silicon layer 63 and the single-crystal silicon substrate 61. The thermally oxidized films on the sidewalls of the moving elements 81 and the stationary part 82 function as sidewall protective films during anisotropic etching in step S6 described below.

Step S5: The thermally oxidized films 113 covering the top surfaces of the single-crystal silicon substrate 61 and the single-crystal silicon layer 63 are etched away to expose their top surfaces. This etching is carried out by RIE using a $CHF_3$—Ar mixture, for instance. Since RIE has substantially no etching action in a direction parallel to the direction of incidence of ions, the thermally oxidized films on the sidewalls of the movable elements 81 and the stationary parts 82 are not removed.

Step S6: Anisotropic etching of the single-crystal silicon layer 63 and the single-crystal silicon substrate 61 is performed using a KOH aqueous solution. As shown, the exposed surface regions of the single-crystal silicon substrate 61 and the single-crystal silicon layer 63, from which the thermally oxidized films 113 were removed in the preceding step S5, are etched away until the regions underlying movable elements 81 are removed. Under the movable elements 81 side etching is caused by the (100), (110) and (311) planes to form depressions 64.

On the other hand, since in the optical fiber receiving channels the narrow filigree structures 112 have a lattice-like configuration as a whole which is parallel to the <110> direction of the single-crystal silicon substrate 61, inverted pyramidal holes 102 by the (111)plane are made, but under the narrow filigree structures 112 the surface of the single-crystal silicon substrate 61 remains unremoved since no side etching takes place there. Thus the depressions 64 are each formed by a group of inverted pyramidal holes 102, and in the depression 64 grid-shaped placement guides 101 are formed.

Step S7: The thermally oxidized films 113 on the sidewalls of the movable elements 81 and the stationary parts 82 and the narrow filigree structures 112 are removed using hydrofluoric acid. Then, though not shown, the electrode pads are formed and, at the same time, a metal film is formed on either side of the mirror. The metal may preferably be gold (Au).

Thus the optical switch shown in FIG. 16 is completed by the steps described above. Incidentally, step S8 in FIG. 17-2 shows the state in which the optical fiber 71 is placed in the fiber receiving channel, and the height of the optical fiber 71 is determined highly accurately by the placement guides 101 formed by the remaining surface regions of the single-crystal silicon substrate 61. The optical fiber 71 is fixed using an adhesive, though not shown.

As described above, according to this embodiment, the depression 64 can be formed between adjacent stationary parts fixedly arranged on the single-crystal silicon substrate 61 can be formed by anisotropic etching of single-crystal silicon, and in the channel for receiving the optical fiber 71 the grid-shaped placement guides 101 can be formed by the remaining surface regions of the single-crystal silicon substrate 61 in the depression 64.

Embodiment 4

In the above embodiment the optical fiber 71 is placed on the grid-shaped placement guides 101. In this embodiment the placement guides are configured as two parallel ribs extending in the optical fiber receiving channel in its lengthwise direction, between which a V-groove is formed to support the optical fiber with high accuracy.

Figure 18:
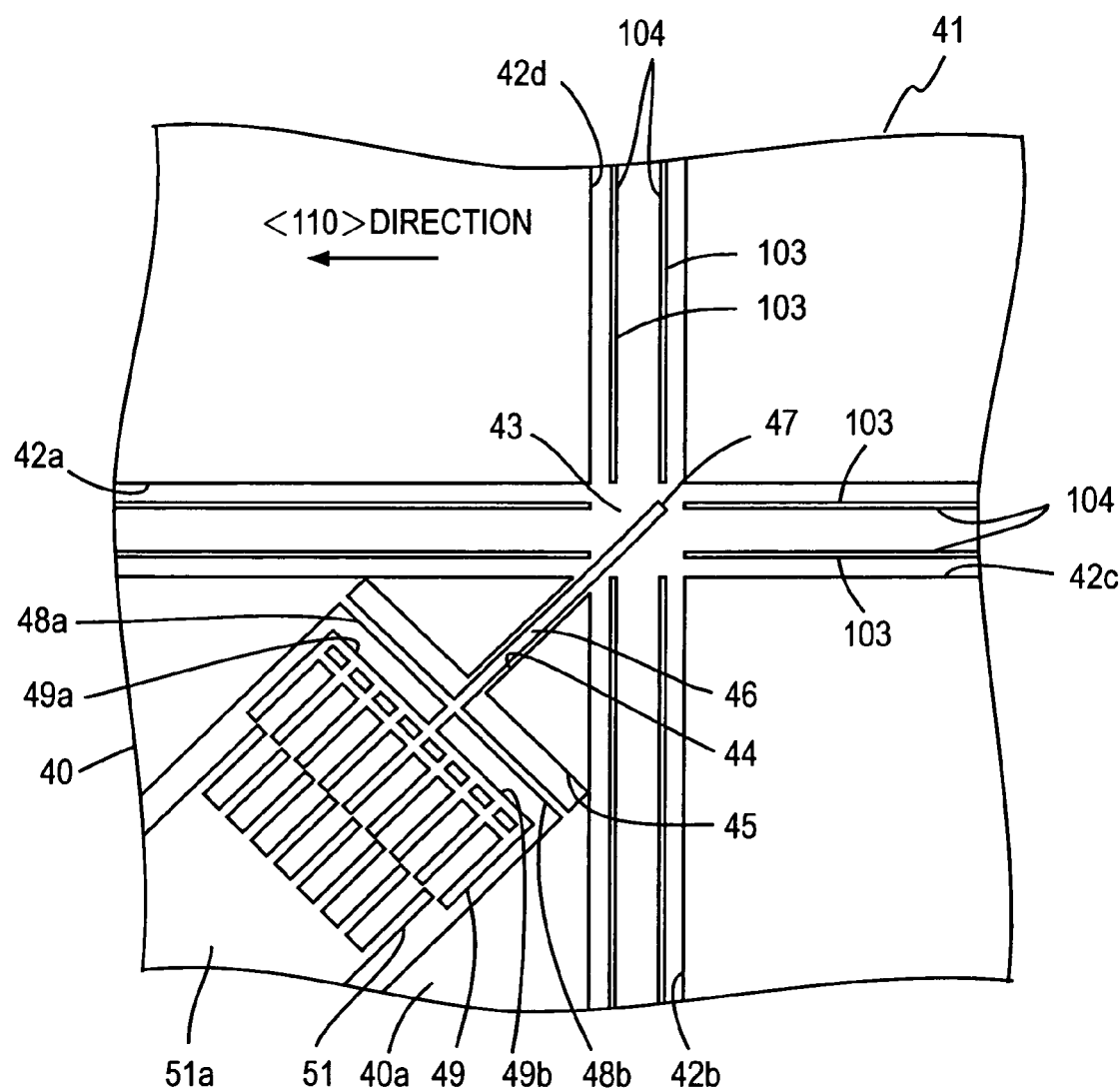
FIG. 18 is a top plan view illustrating an optical switch according to a fourth embodiment of the present invention.

FIG. 18 illustrates an optical switch according to this embodiment. The parts corresponding to those in FIG. 16 are identified by the same reference numerals.

In this embodiment, a placement guide 104 composed of two parallel ribs 103 formed by the remaining surface regions of the single-crystal silicon substrate 61 are provided in each of the optical fiber receiving channels 42a to 42d. The ribs 103 are extended in parallel to the optical fiber receiving channel, that is, in the <110> direction of the single-crystal silicon substrate 61. The two ribs 103 of the placement guide 104 defines therebetween a V-groove.

Figure 19:
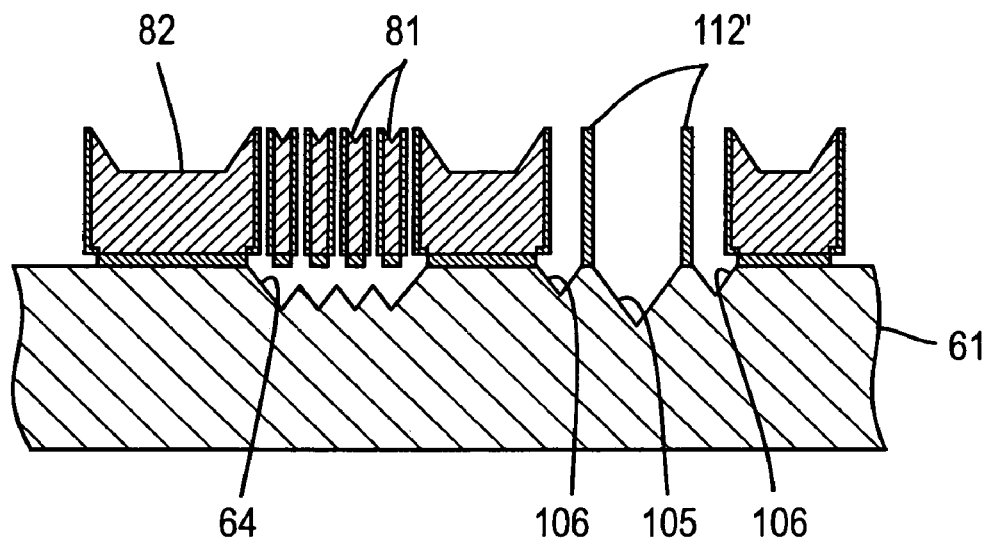
FIG. 19 is a cross-sectional view schematically showing one of steps involved in the manufacture of the optical switch of FIG. 18.

FIG. 19 shows, in correspondence to step S6 in FIG. 17-2, how the V-groove is formed. In this example, two narrow filigree structures 112' extending in parallel are formed in the optical fiber receiving channel by the same steps as those S1 to S5 in FIGS. 17-1 and 17-2, and by anisotropic etching of single-crystal silicon, a V-groove 105 in the (111)plane is formed in the top surface of the single-crystal silicon substrate 61 between the narrow filigree structures 112'. V-groove 106 are also formed outside the two narrow filigree structures 112'.

Figure 20:
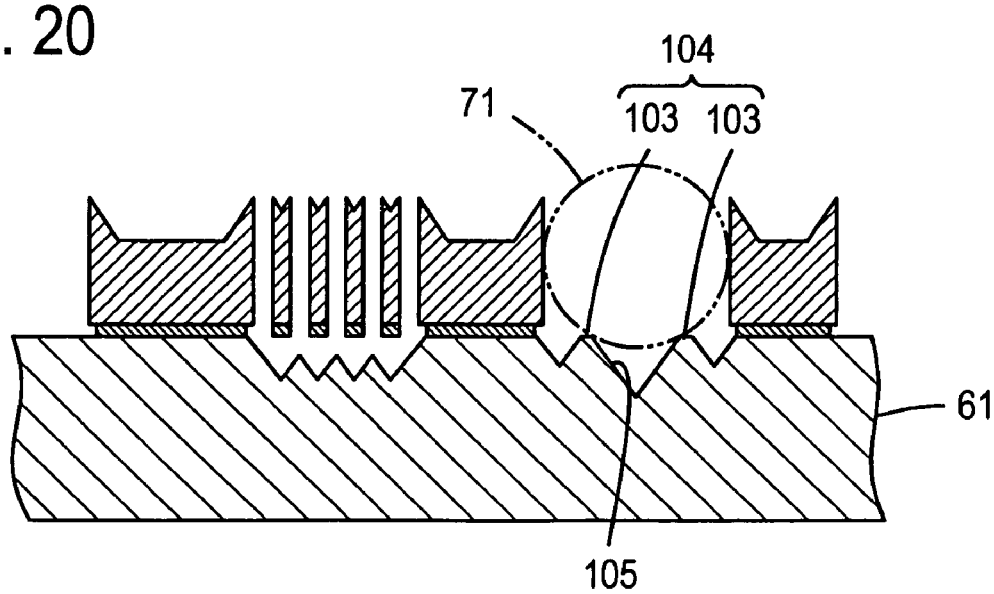
FIG. 20 is a cross-sectional view schematically showing the optical switch of FIG. 18 with an optical fiber installed thereon.

FIG. 20 shows the state in which the optical fiber 71 is placed in the V-groove 105 between the two parallel ribs 103 forming the placement guide 104; the V-groove 105 ensures highly accurate positioning of the optical fiber 71. Furthermore, the V-groove 105 permits accurate positioning of the optical fiber in the horizontal direction as well as in the vertical direction, and by a design choice of the V-groove 105, that is, by a suitable selection of the spacing between the two ribs 103 formed by the remaining surface regions of the single-crystal silicon substrate 61, the height of the optical axis of the optical fiber 71 can also be adjusted with ease.

Figures 1, 21:
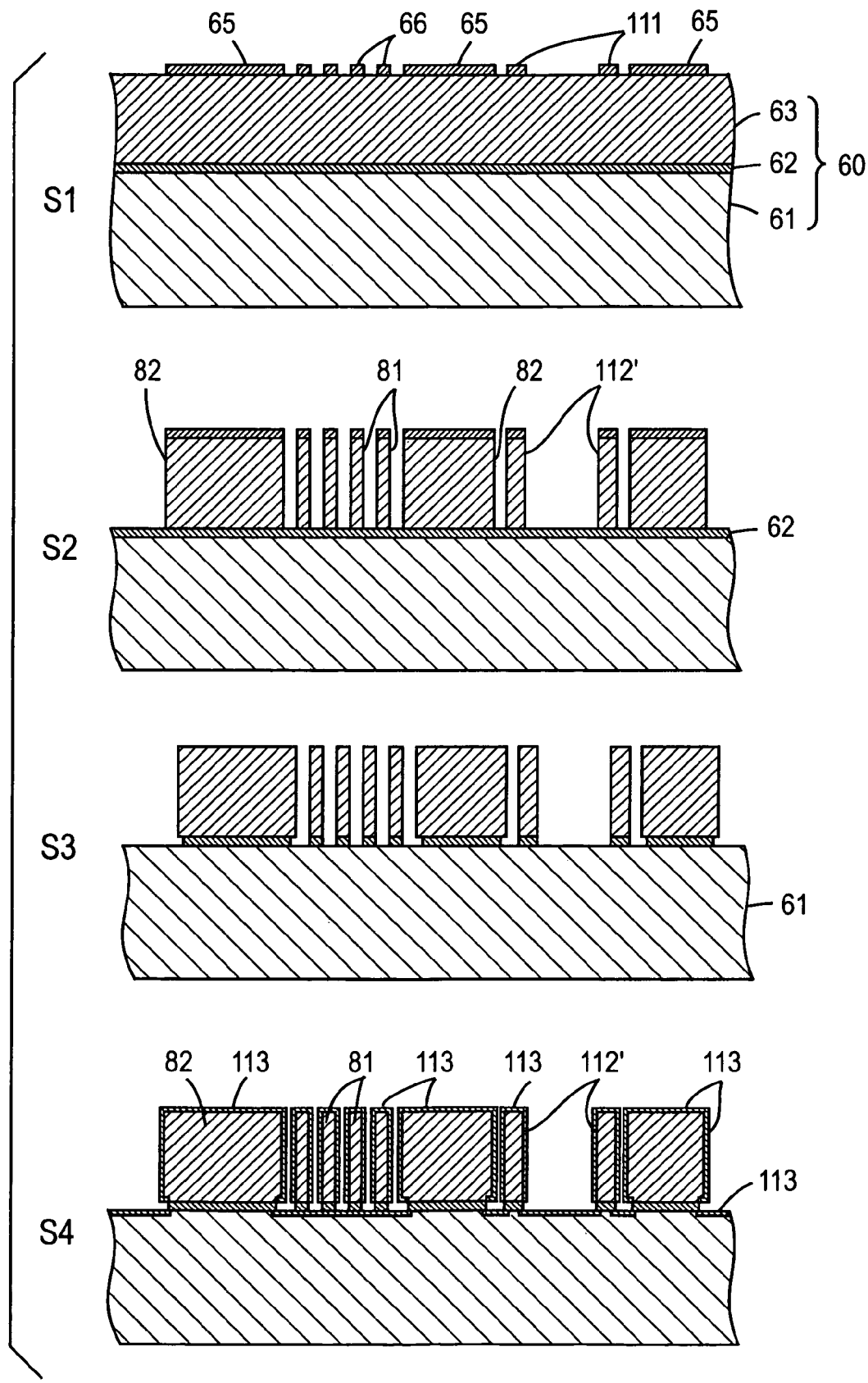
Figures 2, 21:
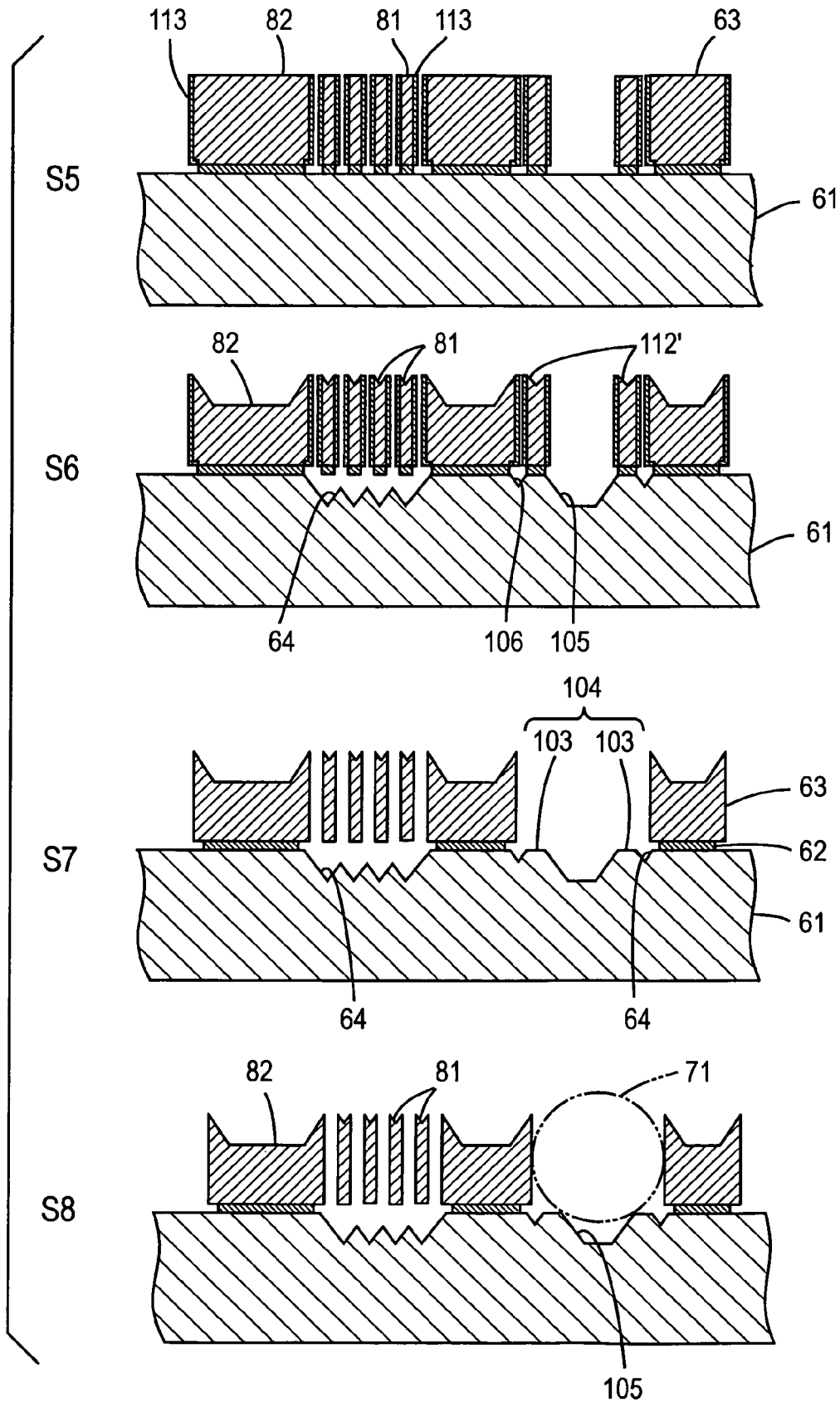

The method for forming the placement guide 104 by the two ribs 103 and forming the V-groove 105 therebetween is not limited specifically to the method described above with reference to FIG. 19. It is also possible to adopt a method in which the patterning width of the masks for the placement guides is made larger than the patterning width of the masks for he movable elements, then thermal oxidation is limited only to the surfaces of the narrow filigree structures, not in their entirety, and the insulating layer regions underlying the narrow filigree structures are etched away to remove the overlying narrow filigree structures. FIGS. 21-1 and 21-2 show a sequence of steps S1 to S8 of this manufacturing method in correspondence to steps S1 to S8 in FIGS. 17-1 and 17-2.

In this example, as shown in step S1 in FIG. 21-1, the patterning width of the masks 111 for placement guides is made larger than the patterning width of the masks 66 for the movable elements, and the surfaces of the narrow filigree structures 112' are thermally oxidized by thermal oxidation of the single-crystal silicon in step S4. Steps S1 to S6 are performed in the same manner as those S1 to S6 in FIGS. 17-1 and 17-2, by which the V-groove 105 is formed between the two narrow filigree structures 112'. The anisotropic etching of single-crystal silicon in step S6 is completed when the V-groove 105 is formed to a desired size.

In step S7 the insulating layer 62 is etched away until the insulating layer 62 remaining on the two ribs 103 forming the placement guide 104 is removed, and at the same time the thermally oxidized films 113 are also etched away. By such removal of the insulating layer 62 by anisotropic etching, the narrow filigree structures 112' are also removed. In this example the insulating layer 62 underlying the movable elements 81 is also etched away unlike in the case of FIG. 19.

The above has described the methods for manufacturing an optical switch, as a microminiature moving device, in which the depressions 64 are formed by anisotropic etching of the single-crystal silicon substrate 61 and, at the same time the placement guides 101 or 104 formed by the remaining surface regions of the single-crystal silicon substrate 61 are formed in the depressions 64 for placement of parts; as compared with the afore-mentioned isotropic etching for the formation of the depressions 64 and the placement guides 91, it is preferable to use anisotropic etching in terms of configuration stability and accuracy.

What is claimed is:

1. A microminiature moving device comprising:
   stationary parts formed of a single-crystal silicon layer of a silicon-on-insulator (SOI) wafer which comprises a single-crystal silicon substrate, an insulating layer disposed on a surface of the single-crystal silicon substrate, and the single-crystal silicon layer disposed on a surface of the insulating layer and fixed to stationary part fixing areas of the surface of said single-crystal silicon substrate by the insulating layer sandwiched therebetween, so that those surface areas except the stationary part fixing areas of the surface of the single-crystal silicon substrate are exposed;
   moveable elements formed of the single-crystal silicon layer of the silicon-on-insulator wafer having at least one end connected to a stationary part so as to be moveable in parallel to the surface of the single-crystal silicon substrate; and
   depressions formed in all the exposed surface areas of the surface of the single-crystal silicon substrate; and
   placement guides formed of projections of said single-crystal silicon substrate in some of said depressions so as to guide placement of device parts,
wherein
   the depressions have a depth greater than the insulating layer thickness;
   said moveable elements are disposed above said depressions;
   the stationary parts have edges overhanging the depressions;
   the insulating layer sandwiched between the stationary parts and the single-crystal silicon substrate has edges that are decreased from the edges of the stationary parts and from edges of the depressions; and
   the projections have un-etched surface regions of the single-crystal silicon substrate at their top ends.

2. The device of claim 1, wherein:
   said placement guides are shaped in lattice-like projections with inverted pyramidal holes at respective spaces between the projections.

3. A microminiature moving device comprising:
   a silicon-on-insulator (SOI) wafer comprising a single-crystal silicon substrate, an insulating layer disposed on a surface of the single-crystal silicon substrate, and a single-crystal silicon layer disposed on the insulating layer;
   stationary parts formed of the single-crystal silicon layer and fixed to stationary part fixing areas of the surface of said single-crystal silicon substrate with the insulating layer sandwiched therebetween;
   movable elements formed of the single-crystal silicon layer having at least one end connected to a stationary part so as to be moveable in parallel to the surface of the single-crystal silicon substrate;
   depressions formed not only in those exposed surface areas of the surface of the substrate above where the movable elements are present but also in the other exposed surface areas of the surface of the substrate above where the movable elements are not present, wherein
   depressions formed in all areas of the surface of the single-crystal silicon substrate except the stationary part fixing areas; and
   placement guides formed by remaining surface regions of said single-crystal silicon substrate in some of said depressions so as to guide placement of device parts;
   wherein the depressions have a depth greater than the insulating layer thickness, said movable elements are disposed above said depressions, and said placement guides are each formed by two parallel ribs separated by a V-groove defined therebetween.

4. A microminiature moving device comprising:

a silicon-on-insulator (SOI) wafer comprising a single-crystal silicon substrate, an insulating layer disposed on a surface of the single-crystal silicon substrate, and a single-crystal silicon layer disposed on the insulating layer;

stationary parts formed in the single-crystal silicon layer and fixed to stationary part fixing areas of the surface of said single-crystal silicon substrate with the insulating layer sandwiched therebetween;

movable elements formed in the single-crystal silicon layer having at least one end connected to a stationary part so as to be moveable in parallel to the surface of the single-crystal silicon substrate;

depressions formed in all areas of the surface of the single-crystal silicon substrate except the stationary part fixing areas; and placement guides formed by remaining surface regions of said single-crystal silicon substrate in some of said depressions so as to guide placement of device parts; wherein the depressions have a depth greater than the insulating layer thickness, said movable elements are disposed above said depressions, said placement guides are lattice-shaped projections, and the top surface of said single-crystal silicon substrate is the (100) plane and grid- shaped members of said placement guides are formed in the <110> direction of said single crystal silicon substrate.

5. The device of claim 3, wherein:

the top surface of said single-crystal silicon substrate is a (100) plane and the ribs of said placement guides are fanned in a <110> direction of said single-crystal silicon substrate.

6. A microminiature moving device that has disposed, on a surface of a single-crystal silicon substrate, movable elements displaceable in parallel to the surface of said single-crystal silicon substrate, and stationary parts, wherein:

said stationary parts are fixed to said single-crystal silicon substrate with an insulating layer sandwiched therebetween;

a plurality of fiber receiving channels are formed between the stationary parts so that the respective fiber receiving channels have exposed channel surface areas of the surface of the substrate at bottom portions thereof;

depressions are formed in those surface areas of said single-crystal silicon substrate where said stationary parts are not present;

said movable elements are disposed above said depressions;

placement guides formed in projections of said single-crystal silicon substrate that project with remaining surface regions of the substrate at top ends thereof are provided in those afraid depressions that are formed in the exposed channel surface areas; and said placement guides are shaped in lattice-like projections with inverted pyramidal holes at respective lattice spaces.

7. A microminiature moving device that has disposed, on a single-crysal silicon substrate, movable elements displaceable in parallel to the surface of said single-crystal silicon substrate, and stationary parts, wherein:

said stationary parts are fixed to said single-crystal silicon substrate with an insulating layer sandwiched therebetween;

depressions are formed in those surface areas of said single-crystal silicon substrate where said stationary parts are not present, said movable elements being disposed above said depressions;

placement guides formed by remaining surface regions of said single-crystal silicon substrate are provided in those of said depressions where to place parts and said placement guides are grid-shaped; and the top surface of said single-crystal silicon substrate is the (100) plane and grid-shaped members of said placement guides are formed in the <110> direction of said single crystal silicon substrate.

8. A microminiature moving device that has disposed, on a single-crystal silicon substrate, movable elements displaceable in parallel to the surface of said single-crystal silicon substrate, and stationary parts, wherein:

said stationary parts are fixed to said single-crystal silicon substrate with an insulating layer sandwiched therebetween; and depressions are formed in those surface areas of said single-crystal silicon substrate where said stationary parts are not present, said movable elements being disposed above said depressions, wherein placement guides formed by remaining surface regions of said single-crystal silicon substrate are provided in those of said depressions where to place parts and wherein said placement guides are each formed by two parallel ribs separated by a V-groove defined therebetween.

9. The device of claim 8, wherein:

the top surface of said single-crystal silicon substrate is a (100) plane and the ribs of said placement guides are formed in a <110> direction of said single-crystal silicon substrate.

10. A microminiature moving device comprising:

stationary parts formed of both a single-crystal silicon layer and an insulating layer of a silicon-on-insulator (SOI) wafer which comprises a single-crystal silicon substrate, the insulating layer disposed on a surface of the single-crystal silicon substrate, and the single-crystal silicon layer disposal on a surface of the insulating layer and fixed to stationary part fixing areas of the surface of said single-crystal silicon substrate byte insulating layer sandwiched therebetween, so that those surface areas where the stationary parts are not present are exposed;

a plurality of fiber receiving channels formed between the stationary parts so that those channel surface areas of the surface of the substrate at bottom portions of the respective fiber receiving channels are exposed;

movable elements formed of both the single-crystal silicon layer and the insulating layer of the silicon-on-insulator wafer and having at least one end connected to a stationary part so as to be moveable in parallel to the surface of the single-crystal silicon substrate; and depressions formed in all the exposed surface areas of the surface of the single-crystal silicon substrate;

the depressions have a depth greater than the insulating layer thickness;

said movable elements are disposed above said depressions;

placement guides formed of projections of said single-crystal silicon substrate in those depressions that are formed in the exposed channel surface areas; and said projections have un-etched surface regions of the single-crystal silicon substrate at their top ends so as to guide placement of parts.

11. A microminiature moving device comprising:

stationary parts formed of a single-crystal silicon layer of a silicon-on-insulator (SOI) wafer which comprises a single-crystal silicon substrate, an insulating layer disposed on a surface of the single-crystal silicon substrate, and the single-crystal silicon layer disposed on a surface of the insulating layer and fixed to stationary part fixing areas of the surface of said single-crystal silicon substrate by the insulating layer sandwiched therebetween, so that those surface areas except the stationary part fixing areas of the surface of the single-crystal silicon substrate are exposed;

movable elements formed of the single-crystal silicon layer of the silicon-on-insulator wafer having at least one end connected to a stationary part so as to be moveable in parallel to the surface of the single-crystal silicon substrate; and depressions formed in all the exposed surface areas of the surface of the single-crystal silicon substrate; and a silicon dioxide film covering:

the depressions;

surface areas of the stationary parts between edges of the stationary parts and edges of the insulating layer; and surface areas of the substrate between edges of the depressions and edges of the insulating layer;

wherein the depressions have a depth greater than the insulating layer thickness;

said movable elements are disposed above said depressions;

the stationary parts have edges overhanging the depressions; and the insulating layer sandwiched between the stationary parts and the single-crystal silicon substrate has edges that are decreased from the edges of the stationary parts and from edges of the depressions.

* * * * *